US011970783B2

United States Patent
Pain et al.

(10) Patent No.: US 11,970,783 B2
(45) Date of Patent: Apr. 30, 2024

(54) SYSTEMS AND METHODS FOR MANUFACTURING ELECTRICAL COMPONENTS USING ELECTROCHEMICAL DEPOSITION

(71) Applicant: FABRIC8LABS, INC., San Diego, CA (US)

(72) Inventors: David Pain, Carlsbad, CA (US); Kareem Shaik, San Diego, CA (US); Charles Pateros, Carlsbad, CA (US)

(73) Assignee: FABRIC8LABS, INC., San Diego, CA (US)

( * ) Notice: Subject to any disclaimer, the term of this patent is extended or adjusted under 35 U.S.C. 154(b) by 0 days.

(21) Appl. No.: 17/951,958

(22) Filed: Sep. 23, 2022

(65) Prior Publication Data
US 2023/0088962 A1    Mar. 23, 2023

Related U.S. Application Data

(60) Provisional application No. 63/247,337, filed on Sep. 23, 2021.

(51) Int. Cl.
*C25D 5/48* (2006.01)
*C25D 5/02* (2006.01)
(Continued)

(52) U.S. Cl.
CPC ............... *C25D 7/123* (2013.01); *C25D 5/02* (2013.01); *C25D 5/48* (2013.01); *C25D 17/08* (2013.01);
(Continued)

(58) Field of Classification Search
None
See application file for complete search history.

(56) References Cited

U.S. PATENT DOCUMENTS

| 4,575,330 A | 3/1986 | Hull |
| 4,678,282 A | 7/1987 | Yaniv et al. |

(Continued)

FOREIGN PATENT DOCUMENTS

| CN | 104178782 | 12/2014 |
| CN | 204097583 | 1/2015 |

(Continued)

OTHER PUBLICATIONS

English translation WO 2021142187 (Year: 2021).*
(Continued)

*Primary Examiner* — Stefanie S Wittenberg
(74) *Attorney, Agent, or Firm* — Kunzler Bean & Adamson

(57) ABSTRACT

A method of making an electrical component includes transmitting electrical energy from a power source through one or more deposition anodes, through an electrolyte solution, and to an intralayer electrical-connection feature of a build plate, such that material is electrochemically deposited onto the intralayer electrical-connection feature and forms an interlayer electrical-connection feature. The method also includes securing a dielectric material so that the dielectric material contacts and electrically insulates the intralayer electrical-connection feature and contacts and at least partially electrically insulates the interlayer electrical-connection feature. The method additionally includes depositing a seed layer onto the dielectric material and the interlayer electrical-connection feature, electrochemically depositing material onto the seed layer, to form at least one second intralayer electrical-connection feature of the electrical component, and removing any one or more portions of the seed layer onto which no portion of the at least one second intralayer electrical-connection feature is formed.

15 Claims, 11 Drawing Sheets

(51) Int. Cl.
*C25D 7/12* (2006.01)
*C25D 17/08* (2006.01)
*C25D 17/12* (2006.01)
*C25D 21/12* (2006.01)
*H05K 3/18* (2006.01)
*H05K 3/40* (2006.01)

(52) U.S. Cl.
CPC ............. *C25D 17/12* (2013.01); *C25D 21/12* (2013.01); *H05K 3/188* (2013.01); *H05K 3/4038* (2013.01)

(56) References Cited

U.S. PATENT DOCUMENTS

| | | |
|---|---|---|
| 5,132,820 A | 6/1992 | Someya et al. |
| 5,403,460 A | 4/1995 | Sala et al. |
| 5,641,391 A | 6/1997 | Hunter et al. |
| 5,998,805 A | 12/1999 | Shi et al. |
| 6,036,834 A | 3/2000 | Clerc |
| 7,839,831 B2 | 11/2010 | Vrcelj et al. |
| 8,168,540 B1 | 5/2012 | Reid et al. |
| 8,681,077 B2 | 3/2014 | Kimura |
| 9,777,385 B2 | 10/2017 | Wirth et al. |
| 10,465,307 B2 | 11/2019 | Pain et al. |
| 10,724,146 B1 | 7/2020 | Pain et al. |
| 10,914,000 B1 | 2/2021 | Pain et al. |
| 10,947,632 B1 | 3/2021 | Pain et al. |
| 11,232,956 B2 | 1/2022 | Pain et al. |
| 11,313,035 B2 | 4/2022 | Pain et al. |
| 11,313,036 B2 | 4/2022 | Pain et al. |
| 11,401,603 B2 | 8/2022 | Pain et al. |
| 2001/0014409 A1 | 8/2001 | Cohen |
| 2003/0006133 A1 | 1/2003 | Metzger |
| 2004/0129573 A1 | 7/2004 | Cohen |
| 2005/0045252 A1 | 3/2005 | Yamasaki et al. |
| 2005/0176238 A1 | 8/2005 | Cohen et al. |
| 2005/0183959 A1 | 8/2005 | Wilson et al. |
| 2005/0202660 A1 | 9/2005 | Cohen et al. |
| 2005/0223543 A1 | 10/2005 | Cohen et al. |
| 2006/0249391 A1* | 11/2006 | Jin ........................ B82Y 40/00 204/224 R |
| 2006/0283539 A1 | 12/2006 | Slafer |
| 2007/0068819 A1 | 3/2007 | Singh et al. |
| 2007/0089993 A1 | 4/2007 | Schwartz et al. |
| 2007/0221504 A1 | 9/2007 | Yuefeng |
| 2010/0300886 A1 | 12/2010 | Lin et al. |
| 2011/0210005 A1 | 9/2011 | Van Den Bossche et al. |
| 2017/0145584 A1 | 5/2017 | Wirth et al. |
| 2019/0160594 A1 | 5/2019 | Flamm et al. |
| 2019/0242024 A1* | 8/2019 | Lazarus ................ B29C 64/118 |
| 2021/0047744 A1 | 2/2021 | Biton |

FOREIGN PATENT DOCUMENTS

| | | |
|---|---|---|
| CN | 104593830 | 5/2015 |
| WO | 2017087884 | 5/2017 |
| WO | 2019150362 | 8/2019 |
| WO | 2021041265 | 3/2021 |

OTHER PUBLICATIONS

Frey et al., "Switch-matrix-based High-Density Microelectrode Array in CMOS Technology", IEEE Journal of SolidState-Circuits, Feb. 2010, pp. 467-482, vol. 45, No. 2.
Stewart et al., "Polysilicon TFT Technology for Active Matrix OLED Displays", IEEE Transactions on Electron Devices, May 2001, pp. 845-851, vol. 48, No. 5.
International Search Report and Written Opinion for PCT/US2020/047531 dated Sep. 29, 2020.
Supplementary International Search Report for PCT/US2020/047531 dated Nov. 22, 2021.
U.S. Appl. No. 17/554,677, filed Dec. 17, 2021.
U.S. Appl. No. 17/566,546, filed Dec. 30, 2021.
U.S. Appl. No. 17/535,437, filed Nov. 24, 2021.
U.S. Appl. No. 17/738,729, filed May 6, 2022.
U.S. Appl. No. 17/863,272, filed Jul. 12, 2022.
Nakamura et al., Incorporation of input function into displays using LTPS TFT technology, Journal of the SID, 2006, pp. 363-369, 14/4.
U.S. Appl. No. 17/903,966, filed Sep. 6, 2022.

\* cited by examiner

SYSTEMS AND METHODS FOR MANUFACTURING ELECTRICAL COMPONENTS USING ELECTROCHEMICAL DEPOSITION

CROSS-REFERENCE TO RELATED APPLICATION

This application claims the benefit of U.S. Provisional Patent Application No. 63/247,337, filed Sep. 23, 2021, which is incorporated herein by reference in its entirety.

FIELD

This disclosure relates generally to manufacturing parts, and more particularly to systems and methods for manufacturing electrical components using electrochemical additive manufacturing techniques.

BACKGROUND

Current techniques for the mass production of electrical components, such as printed circuit boards, includes at least the processes of photomasking, etching, and drilling (or other material removal process). For example, conventional printed circuit board manufacturing techniques for each layer of a printed circuit board require plating a dielectric substrate with a metallic layer, commonly made of copper, applying a patterned photomask onto the metallic layer, and etching away exposed portions of the metallic layer not covered by the photomask. The patterned photomask is then removed in a separate cleaning process. The dielectric substrate and the remaining portions of the metallic layer form one layer of the printed circuit board. Multiple layers, formed in this manner, are laminated together to form a multi-layer printed circuit board. Electrical connectivity between layers of a multi-layer printed circuit board is provided by drilling holes through at least one dielectric substrate and filling the drilled hole with a metallic material to form a via. Forming printing circuit boards using photomasking, etching, and drilling in this manner can be cumbersome, time consuming, and expensive.

SUMMARY

The subject matter of the present application has been developed in response to the present state of the art, and in particular, in response to the shortcomings of conventional systems and methods for additive manufacturing of electrical components, such as printed circuit boards, which have not yet been fully solved by currently available techniques. Accordingly, the subject matter of the present application has been developed to provide systems and methods for the electrochemical additive manufacturing of electrical parts, including printed circuit boards, which overcome at least some of the above-discussed shortcomings of prior art techniques.

The following is a non-exhaustive list of examples, which may or may not be claimed, of the subject matter, disclosed herein.

Disclosed herein is a method of making an electrical component. The method comprises a step of positioning a build plate relative to an electrolyte solution such that an intralayer electrical-connection feature of the build plate directly contacts the electrolyte solution. The method also comprises a step of positioning a deposition anode array, which comprises a plurality of deposition anodes, into the electrolyte solution such that a gap is established between the intralayer electrical-connection feature and the deposition anode array. The method further comprises a step of connecting the intralayer electrical-connection feature of the build plate to a power source. The method additionally comprises a step of connecting one or more deposition anodes of the plurality of deposition anodes to the power source. The method also comprises a step of transmitting electrical energy from the power source through the one or more deposition anodes of the plurality of deposition anodes, through the electrolyte solution, and to the intralayer electrical-connection feature of the build plate, such that electrically-conductive material is deposited onto the intralayer electrical-connection feature and forms an interlayer electrical-connection feature of the electrical component. The interlayer electrical-connection feature is formed on the intralayer electrical-connection feature. The method further comprises a step of securing a dielectric material to the build plate so that the dielectric material contacts and electrically insulates the intralayer electrical-connection feature and contacts and at least partially electrically insulates the interlayer electrical-connection feature. The method additionally comprise a step of depositing a seed layer, which is made of an electrically conductive material, onto the dielectric material and the interlayer electrical-connection feature. The method also comprises a step of positioning the build plate relative to the electrolyte solution such that the seed layer directly contacts the electrolyte solution. The method further comprises a step of positioning the deposition anode array into the electrolyte solution such that a gap is established between the seed layer and the deposition anode array. The method additionally comprises a step of connecting the seed layer to the power source. The method also comprises a step of transmitting electrical energy from the power source through the one or more deposition anodes of the plurality of deposition anodes, through the electrolyte solution, and to the seed layer, such that electrically-conductive material is deposited onto at least a portion of the seed layer and forms at least one second intralayer electrical-connection feature of the electrical component. The method further comprises a step of removing any one or more portions of the seed layer onto which no portion of the at least one second intralayer electrical-connection feature is formed. The preceding subject matter of this paragraph characterizes example 1 of the present disclosure.

The step of securing the dielectric material to the build plate comprises flowing the dielectric material into contact with the build plate, the intralayer electrical-connection feature, and the interlayer electrical-connection feature. The step of securing the dielectric material to the build plate also comprises solidifying the dielectric material. The preceding subject matter of this paragraph characterizes example 2 of the present disclosure, wherein example 2 also includes the subject matter according to example 1, above.

The method further comprises moving the build plate, the intralayer electrical-connection feature, and the interlayer electrical-connection feature out of the electrolyte solution and into a position offset from a dielectric containment structure. Flowing the dielectric material comprises flowing the dielectric material into a gap defined between the dielectric containment structure and the build plate. The intralayer electrical-connection feature and the interlayer electrical-connection feature are located in the gap. The preceding subject matter of this paragraph characterizes example 3 of the present disclosure, wherein example 3 also includes the subject matter according to example 2, above.

The step of securing the dielectric material to the build plate comprises forming a patterned dielectric substrate and attaching the patterned dielectric substrate to the build plate. The preceding subject matter of this paragraph characterizes example 4 of the present disclosure, wherein example 4 also includes the subject matter according to example 1, above.

The patterned dielectric substrate is formed and attached to the build plate before the interlayer electrical-connection feature is formed. The preceding subject matter of this paragraph characterizes example 5 of the present disclosure, wherein example 5 also includes the subject matter according to example 4, above.

The patterned dielectric substrate comprises an opening. Forming the interlayer electrical-connection feature comprises depositing the electrically-conductive material into the opening of the patterned dielectric substrate. The preceding subject matter of this paragraph characterizes example 6 of the present disclosure, wherein example 6 also includes the subject matter according to example 5, above.

The patterned dielectric substrate is attached to the build plate after the interlayer electrical-connection feature is formed. The preceding subject matter of this paragraph characterizes example 7 of the present disclosure, wherein example 7 also includes the subject matter according to any of example 4, above.

The patterned dielectric substrate comprises an opening. The patterned dielectric substrate is attached to the build plate so that the interlayer electrical-connection feature is received within the opening. The preceding subject matter of this paragraph characterizes example 8 of the present disclosure, wherein example 8 also includes the subject matter according to example 7, above.

The interlayer electrical-connection feature occupies only a portion of the opening. The method further comprises positioning the build plate relative to the electrolyte solution such that interlayer electrical-connection feature of the build plate directly contacts the electrolyte solution. The method also comprises positioning a deposition anode array, comprising a plurality of deposition anodes, into the electrolyte solution such that a gap is established between the interlayer electrical-connection feature and the deposition anode array. The method additionally comprises connecting the interlayer electrical-connection feature of the build plate to the power source. The method also comprises connecting one or more deposition anodes of the plurality of deposition anodes to the power source. The method further comprises transmitting electrical energy from the power source through the one or more deposition anodes of the plurality of deposition anodes, through the electrolyte solution, and to the interlayer electrical-connection feature of the build plate, such that electrically-conductive material is deposited into the opening and onto the interlayer electrical-connection feature. The preceding subject matter of this paragraph characterizes example 9 of the present disclosure, wherein example 9 also includes the subject matter according to example 8, above.

The build plate further comprises a second dielectric material in contact with and at least partially electrically isolating the intralayer electrical-connection feature. The dielectric material is secured to the second dielectric material of the build plate. The preceding subject matter of this paragraph characterizes example 10 of the present disclosure, wherein example 10 also includes the subject matter according to any of examples 4-9, above.

The build plate comprises multiple intralayer electrical-connection features, which are electrically isolated from each other. The multiple intralayer electrical-connection features are separately connected to the power source. The electrical energy from the power source is concurrently and separately transmitted through two or more deposition anodes of the plurality of deposition anodes, through the electrolyte solution, and to the multiple intralayer electrical-connection features such that the electrically-conductive material is separately deposited onto each one of the multiple intralayer electrical-connection features and forms multiple interlayer electrical-connection features of the electrical component. The preceding subject matter of this paragraph characterizes example 11 of the present disclosure, wherein example 11 also includes the subject matter according to any of examples 1-10, above.

The electrically-conductive material deposited onto the at least the portion of the seed layer further forms a second interlayer electrical-connection feature. The second interlayer electrical-connection feature is formed on the at least one second intralayer electrical-connection feature. The preceding subject matter of this paragraph characterizes example 12 of the present disclosure, wherein example 12 also includes the subject matter according to any of examples 1-11, above.

The electrically-conductive material deposited onto the intralayer electrical-connection feature forms multiple interlayer electrical-connection features, spaced-apart from each other about the intralayer electrical-connection feature. The preceding subject matter of this paragraph characterizes example 13 of the present disclosure, wherein example 13 also includes the subject matter according to any of examples 1-12, above.

The electrical component is a printed circuit board. The intralayer electrical-connection feature is an electrical trace or an electrical contact pad of the printed circuit board. The interlayer electrical-connection feature is a via of the printed circuit board. The preceding subject matter of this paragraph characterizes example 14 of the present disclosure, wherein example 14 also includes the subject matter according to any of examples 1-13, above.

The method further comprises securing a second dielectric material to the dielectric material so that the second dielectric material contacts and electrically insulates the at least one second intralayer electrical-connection feature. The preceding subject matter of this paragraph characterizes example 15 of the present disclosure, wherein example 15 also includes the subject matter according to any of examples 1-14, above.

Further disclosed herein is a system for making an electrical component. The system comprises a build plate that comprises an intralayer electrical-connection feature. The system also comprises a deposition anode array that comprises a plurality of deposition anodes. The system further comprises an electrodeposition cell that is configured to hold an electrolyte solution. The system additionally comprises a mounting system that is configured to position the intralayer electrical-connection feature and the plurality of deposition anodes in direct contact with the electrolyte solution, such that a gap is established between the intralayer electrical-connection feature and the plurality of deposition anodes, when the electrolyte solution is held in the electrodeposition cell. The system also comprises a power source that is configured to create a voltage potential on the intralayer electrical-connection feature. The system further comprises a positioning system that is configured to control a distance between the intralayer electrical-connection feature and the plurality of deposition anodes. The system additionally comprises a controller that is configured to control a current field across at least some deposition anodes of the plurality of deposition anodes, when the electrodeposition cell holds the electrolyte solution, and when the intralayer electrical-connection feature and the plurality of deposition anodes are positioned in direct contact with the electrolyte solution, to selectively deposit electrically-conductive material onto the intralayer electrical-connection feature to form an interlayer electrical-connection feature of the electrical component. The system also comprises a dielectric application station that is configured to secure a dielectric material to the build plate so that the dielectric material contacts and electrically insulates the intralayer electrical-connection feature and contacts and at least partially electrically insulates the interlayer electrical-connection feature. The system further comprises a plating station that is configured to deposit a seed layer, made of an electrically conductive material, onto the dielectric material and the interlayer electrical-connection feature after the dielectric application station couples the dielectric material to the build plate. The controller is further configured to control a current field across at least some deposition anodes of the plurality of deposition anodes, when the electrodeposition cell holds the electrolyte solution, when the seed layer is formed, and when the seed layer and the plurality of deposition anodes are positioned in direct contact with the electrolyte solution, to selectively deposit electrically-conductive material onto the seed layer to form at least one second intralayer electrical-connection feature of the electrical component. The system additionally comprises an etching station that is configured to remove one or more portions of the seed layer, onto which the electrically-conductive material is not deposited. The preceding subject matter of this paragraph characterizes example 16 of the present disclosure.

The dielectric application station is configured to form a hole in the dielectric material. The electrically-conductive material is selectively deposited into the hole to form the intralayer electrical-connection feature. The preceding subject matter of this paragraph characterizes example 17 of the present disclosure, wherein example 17 also includes the subject matter according to example 16, above.

The dielectric application station comprises a dielectric source configured to contain the dielectric material in a flowable state. The dielectric application station is further configured to inject the dielectric material from the dielectric source into contact with the build plate, the intralayer electrical-connection feature, and the interlayer electrical-connection feature. The dielectric application station is further configured to solidify the dielectric material. The preceding subject matter of this paragraph characterizes example 18 of the present disclosure, wherein example 18 also includes the subject matter according to any of examples 16-17, above.

The dielectric application station is further configured to secure a second dielectric material to the dielectric material so that the second dielectric material contacts and at least partially electrically insulates the second intralayer electrical-connection feature. The preceding subject matter of this paragraph characterizes example 19 of the present disclosure, wherein example 19 also includes the subject matter according to any of examples 16-18, above.

The controller is further configured to control a current field across at least some deposition anodes of the plurality of deposition anodes, when the electrodeposition cell holds the electrolyte solution, when the second intralayer electrical-connection feature and the plurality of deposition anodes are positioned in direct contact with the electrolyte solution, to selectively deposit electrically-conductive material onto the second intralayer electrical-connection feature to form at least one second interlayer electrical-connection feature of the electrical component. The preceding subject matter of this paragraph characterizes example 20 of the present disclosure, wherein example 20 also includes the subject matter according to example 19, above.

The described features, structures, advantages, and/or characteristics of the subject matter of the present disclosure may be combined in any suitable manner in one or more examples and/or implementations. In the following description, numerous specific details are provided to impart a thorough understanding of examples of the subject matter of the present disclosure. One skilled in the relevant art will recognize that the subject matter of the present disclosure may be practiced without one or more of the specific features, details, components, materials, and/or methods of a particular example or implementation. In other instances, additional features and advantages may be recognized in certain examples and/or implementations that may not be present in all examples or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific examples that are illustrated in the appended drawings. Understanding that these drawings, which are not necessarily drawn to scale, depict only certain examples of the subject matter and are not therefore to be considered to be limiting of its scope, the subject matter will be described and explained with additional specificity and detail through the use of the drawings, in which.

DETAILED DESCRIPTION

Reference throughout this specification to "one example," "an example," or similar language means that a particular feature, structure, or characteristic described in connection with the example is included in at least one example of the present disclosure. Appearances of the phrases "in one example," "in an example," and similar language throughout this specification may, but do not necessarily, all refer to the same example. Similarly, the use of the term "implementation" means an implementation having a particular feature, structure, or characteristic described in connection with one or more examples of the present disclosure, however, absent an express correlation to indicate otherwise, an implementation may be associated with one or more examples.

Disclosed herein are examples of using electrochemical additive manufacturing processes for constructing electrical components by reducing charged metal ions onto a surface in an electrolyte solution. Electrochemical additive manufacturing, otherwise known as electrochemical deposition manufacturing, includes placement of a printhead, including at least one deposition anode, physically close to a cathode in the presence of a deposition solution (e.g., an electrolyte), and energizing the deposition anode, which causes an electrical charge to flow through the deposition anode. The flow of the electrical charge through the deposition anode creates an electrochemical reduction reaction to occur at the cathode, near the deposition anode, which results in the deposition of material on the cathode. Utilizing electrochemical additive manufacturing processes to help make electrical components, particularly multi-layer components with intra-layer and interlayer electrical connection features, enables the elimination of photoresists and masks, and helps to reduce the complexity, time, and cost of making such electrical component.

The cathode of the electrochemical additive manufacturing method and system disclosed herein is a cathode portion of a build plate. In some examples, the build plate can be a single-purpose metallic plate that provides the single function of a surface of a system onto which an electrical component is at least partially formed using electrochemical additive manufacturing. However, in other examples, the build plate is a multi-purpose build plate, which includes a portion of an electrical component, and at least an additional portion of the electrical component is formed used electrochemical additive manufacturing. Accordingly, the cathode portion of the build plate can be a non-patterned metallic surface or a patterned conductive surface.

Figure 1:
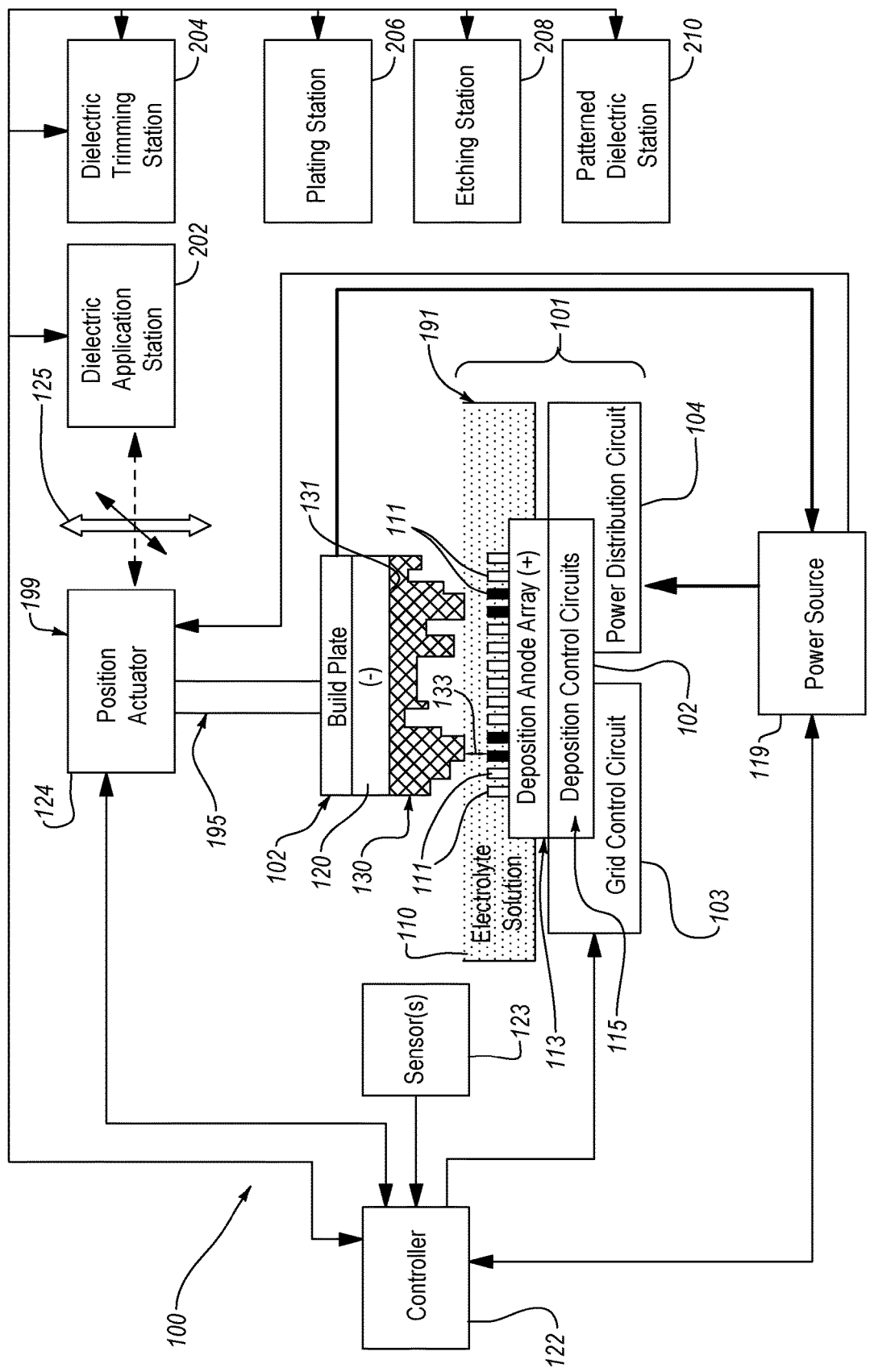
FIG. 1 is a schematic, side elevation view of an electrochemical deposition system, according to one or more examples of the present disclosure.

Referring to FIG. 1, according to some examples, a system 100 includes features for enabling an electrochemical deposition process. For example, the system 100 includes a printhead 101 that contains at least one deposition anode 111. In certain examples, the printhead 101 contains a plurality of deposition anodes 111 arranged into a deposition anode array 113. The printhead 101 further includes at least one deposition control circuit corresponding with the deposition anode 111. In examples where the printhead 101 contains the deposition anode array 113, the printhead 101 includes a plurality of deposition control circuits 115 where at least one of the deposition control circuits 115 corresponds with each one of the deposition anodes 111 of the deposition anode array 113. The deposition control circuits 115 are organized into a matrix arrangement, in some examples, thereby supporting a high resolution of deposition anodes 111. The deposition anodes 111 of the deposition anode array 113 are arranged to form a two-dimensional grid in some examples. In FIG. 1, one dimension of the grid is shown with the other dimension of the grid going into and/or coming out of the page.

The printhead 101 further includes a grid control circuit 103 that transmits control signals to the deposition control circuits 115 to control the amount of electrical current flowing through each one of the deposition anodes 111 of the deposition anode array 113. The printhead 101 additionally includes a power distribution circuit 104. The electrical current, supplied to the deposition anodes 111 via control of the grid control circuit 103, is provided by the power distribution circuit 104, which routes power from an electrical power source 119 of the system 100 to the deposition control circuits 115 and then to the deposition anodes 111. Although not shown, in some examples, the printhead 101 also includes features, such as insulation layers, that help protect other features of the printhead 101 from an electrolyte solution 110, as described in more detail below.

The system 100 further includes a build plate 102 and the electrolyte solution 110, which can be contained within a partially enclosed container (e.g., electrodeposition cell 191). In some examples, the electrolyte solution 110 includes one or more of, but not limited to, plating baths, associated with copper, nickel, tin, silver, gold, lead, etc., and which are typically comprised of water, an acid (such as sulfuric acid), metallic salt, and additives (such as levelers, suppressors, surfactants, accelerators, grain refiners, and pH buffers). The system 100 is configured to move the printhead 101 relative to the electrolyte solution 110 such that the deposition anodes 111 of the deposition anode array 113 are submersed in the electrolyte solution 110.

When submersed in the electrolyte solution 110, as shown in FIG. 1, when a cathode portion 120 of the build plate 102 and at least one of the deposition anodes 111 are connected to a power source 119, and when an electrical current is supplied to the deposition anodes 111 from the power source 119, an electrical path (or current) is formed through the electrolyte solution 110 from each one of the deposition anodes 111 to a conductive surface 131 of the cathode portion 120 of the build plate 102. In such an example, the cathode portion 120 functions as the cathode of a cathode-anode circuit of the system 100. The electrical paths in the electrolyte solution 110 induce electrochemical reactions in the electrolyte solution 110, between the deposition anodes 111 and the conductive surface 131 of the cathode portion 120, which results in the formation (e.g., deposition) of material 130 (e.g., layers of metal) on the conductive surface 131 of the cathode portion 120 at locations corresponding to the locations of the deposition anodes 111. The material 130, which can be layers of metal, formed by supplying electrical current to multiple deposition anodes 111 form one or more layers or portions of an electrical component in some examples. The cathode portion 120 can be made of any of various metallic materials, such as, but not limited to, a chemically-activated stainless steel, which promotes removal of parts affixed or deposited to build plate 102. The build plate 102, and cathode portion 120, can be rigid or flexible. Flexibility of the build plate 102 promotes removal of parts affixed or deposited to build plate 102.

Multiple layers, in a stacked formation, at a given location on the cathode portion 120 of the build plate 102 can be formed by incrementally moving the build plate 102, and thus the cathode portion 120, away from the depositions anodes 111 and consecutively supplying an electrical current to the deposition anode 111 corresponding with that location. The material 130 can have an intricate and detailed shape by modifying or alternating the current flowing through the deposition anodes 111. For example, as shown in FIG. 1, first ones of the deposition anodes 111 are energized (shaded in FIG. 1), so that the material 130 is being deposited near these "energized" deposition anodes 111, when second ones of the deposition anodes are not energized (unshaded in FIG. 1), so that the material 130 is not being deposited near these "non-energized" deposition anodes 111.

In some examples, the system 100 further includes a controller 122. The printhead 101 is electrically coupled with the controller 122 such that the controller 122 can transmit electrical signals to the grid control circuit 103. In response to receipt of the electrical signals from the controller 122, the grid control circuit 103 sends corresponding electrical signals to the deposition control circuits 115 to selectively turn one or more of the deposition anodes 111 of the deposition anode array 113 on or off (or to modify the intensity of electrical current flow through each deposition anode 111). The controller 122 may be, for example and without limitation, a microcontroller, a microprocessor, a GPU, a FPGA, a SoC, a single-board computer, a laptop, a notebook, a desktop computer, a server, or a network or combination of any of these devices.

According to certain examples, the system 100 additionally includes one or more sensors 123. The controller 122 is electrically coupled with the sensors 123 to receive feedback signals from the sensors 123. The feedback signals include sensed characteristics of the system 100 that enable a determination of the progress of the metal deposition process for forming the material 130. The sensors 123 may include, for example and without limitation, current sensors, voltage sensors, timers, cameras, rangefinders, scales, force sensors, and/or pressure sensors.

One or more of the sensors 123 can be used to measure a distance between the cathode portion 120 and the deposition anode array 113. Measuring the distance between the cathode portion 120 and the deposition anode array 113 enables "zeroing" of the deposition anode array 113 relative to the cathode portion 120 before the material 130 is formed, or to set or confirm the relative position between the deposition anode(s) 111 and cathode portion 120 before forming each successive metal layer of the material 130. The accurate positioning of the cathode portion 120 relative to the deposition anode array 113 at the initialization of the deposition process may have a significant impact on the success and quality of the completed deposit. In certain examples, any of various types of sensors, for determining the distance between the cathode portion 120 and the deposition anode array 113 can be used, including, for example and without limitation, mechanical, electrical, or optical sensors, or combinations thereof. In one or more examples, mechanical sensors, such as a pressure sensor, switch, or load cell may be employed, which detects when the build plate 102, including the cathode portion 120, is moved and relocated into a desired location. In one or more examples, one or more components of the system 100 may be energized, and the cathode portion 120 may be moved into proximity of the energized components. When a corresponding voltage or current is detected on the cathode portion 120, the cathode portion 120 can be considered to be in a known location. According to some examples, other types of sensors, such as those that detect, for example, capacitance, impedance, magnetic fields, or that utilize the Hall Effect, can be used to determine the location of the cathode portion 120 relative to the deposition anode array 113.

Referring to FIG. 1, the system 100 further includes a mounting system 195 and a positioning system 199, which includes a position actuator 124. As shown in the illustrated example, the build plate 102 is coupled to the position actuator 124, or an additional or alternative position actuator of the positioning system 199, via the mounting system 195. The mounting system 195 is configured to retain the build plate 102 and to enable the cathode portion 120 of the build plate 102 to be positioned in the electrodeposition cell 191. Actuation of the position actuator 124 moves the mounting system 195 and the build plate 102 relative to the printhead 101 (and thus relative to the deposition anode array 113). However, in other examples, the printhead 101, rather than the build plate 102, is coupled to the position actuator 124 such that actuation of the position actuator 124 moves the printhead 101 relative to the build plate 102. In yet other examples, both the build plate 102 and the printhead 101 are coupled to the position actuator 124, such that actuation of the position actuator 124 results in one or both of the build plate 102 and the printhead 101 moving relative to the other.

The position actuator 124 can be a single actuator or multiple actuators that collectively form the position actuator 124. In certain examples, the position actuator 124 controls vertical movement 125, so that the build plate 102 may be raised, relative to the printhead 101, as successive layers of the material 130 are built. Alternatively, or additionally, in some examples, the position actuator 124 controls vertical movement 125, so that the printhead 101 may be lowered, relative to the build plate 102, as successive layers of the material 130 are built. In one or more examples, the position actuator 124 also moves the build plate 102, moves the printhead 101, or moves both the build plate 102 and the printhead 101 horizontally, relative to one another, so that, for example, parts having a footprint larger than the footprint of the deposition anode array 113 can be formed (see, e.g., dashed directional arrows associated with the directional arrow corresponding with the vertical movement 125).

Although not shown with particularity in FIG. 1, in one or more examples, the system 100 includes a fluid handling system fluidically coupled with the electrodeposition cell 191. The fluid handling system may include for example a tank, a particulate filter, chemically resistant tubing, and a pump. The system 100 can further include analytical equipment that enables continuous characterization of bath pH, temperature, and ion concentration using methods such as conductivity, high performance liquid chromatography, mass spectrometry, cyclic voltammetry stripping, spectrophotometer measurements, or the like. Bath conditions may be maintained with a chiller, heater and/or an automated replenishment system to replace solution lost to evaporation and/or ions of deposited material.

Although the system 100 shown in FIG. 1 has a single printhead 101 with a single deposition anode array 113, in one or more alternative examples, the system 100 includes multiple printheads 101, each with one or more deposition anode arrays 113, or a single printhead 101 with multiple deposition anode arrays 113. These multiple deposition anode arrays 113 may operate simultaneously in different chambers filled with electrolyte solution, or may be tiled in a manner where the deposition anode arrays 113 work together to deposit material on a shared build plate or series of build plates.

Figure 17:
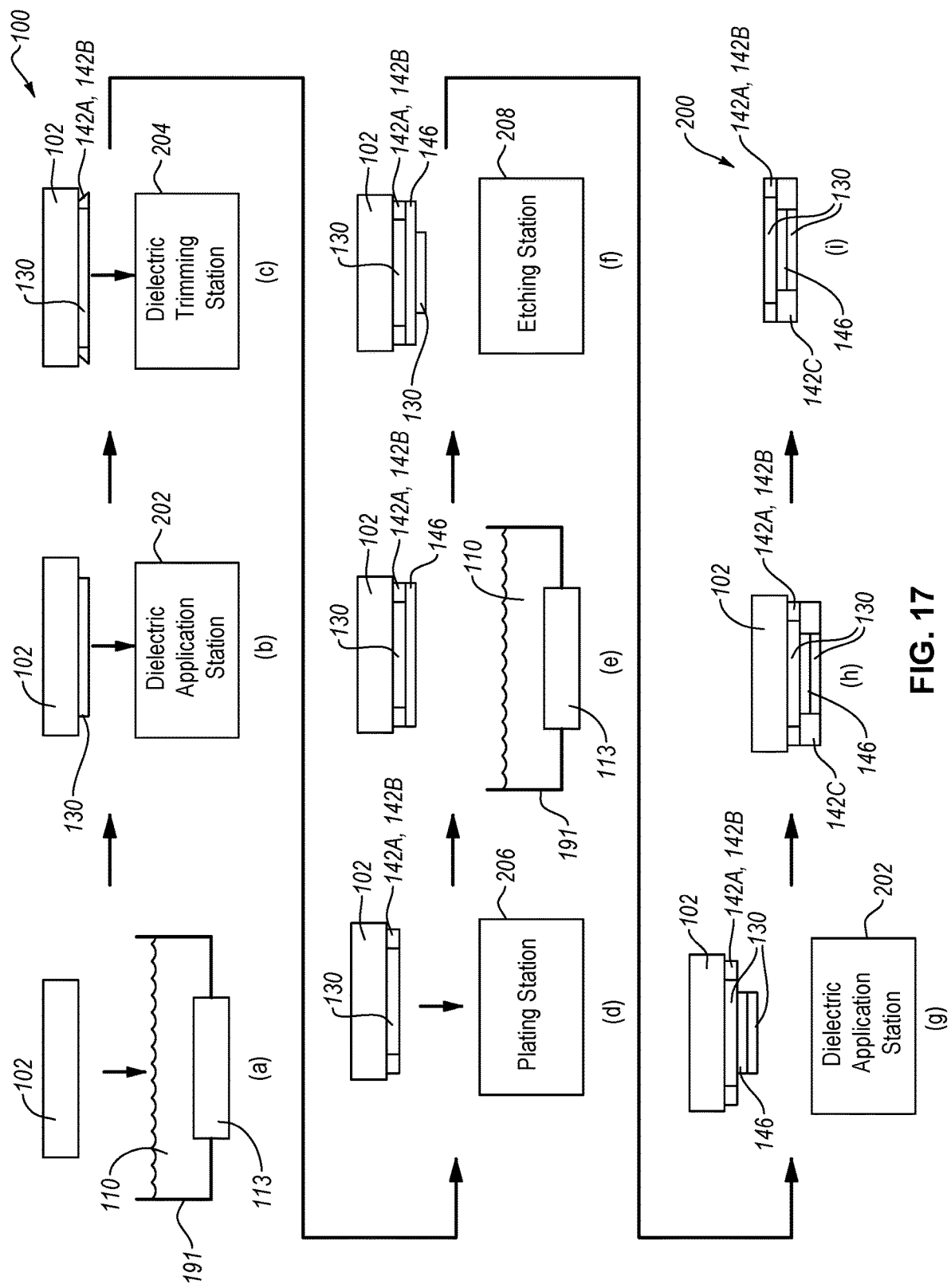
FIG. 17 is a schematic, flow diagram of a method of making an electrical component using the system of FIG. 1, according to one or more examples of the present disclosure.
Figure 18:
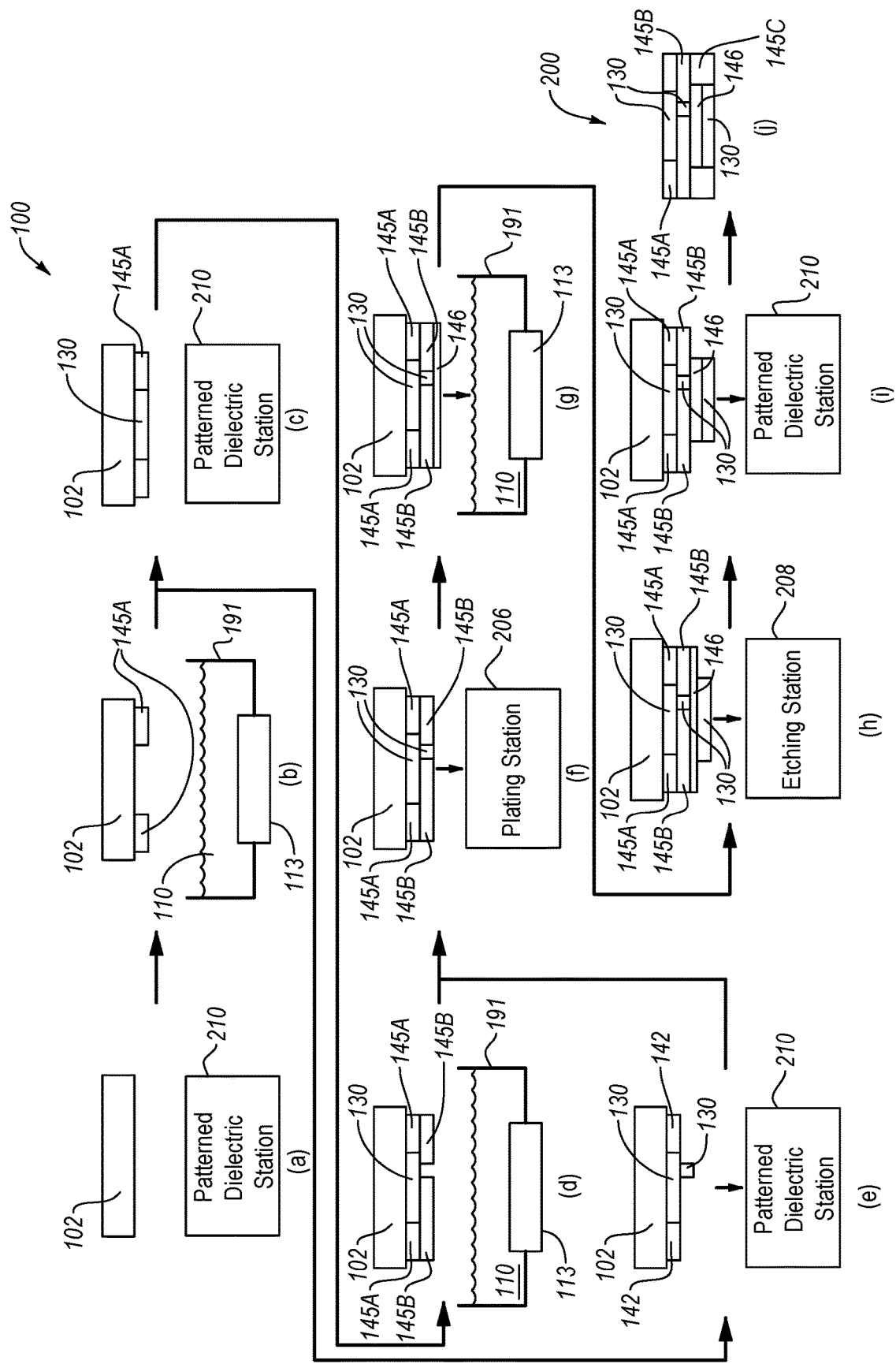
FIG. 18 is a schematic, flow diagram of a method of making an electrical component using the system of FIG. 1, according to one or more examples of the present disclosure.

As shown in FIGS. 1, 17, and 18, the system 100 includes other features, used in conjunction with the electrochemical deposition features, to help make an electrical component. As explained in more detail below, the system 100 includes one or more of a dielectric application station 202, a dielectric trimming station 204, a plating station 206, an etching station 208, and a patterned dielectric station 210.

Figure 2:
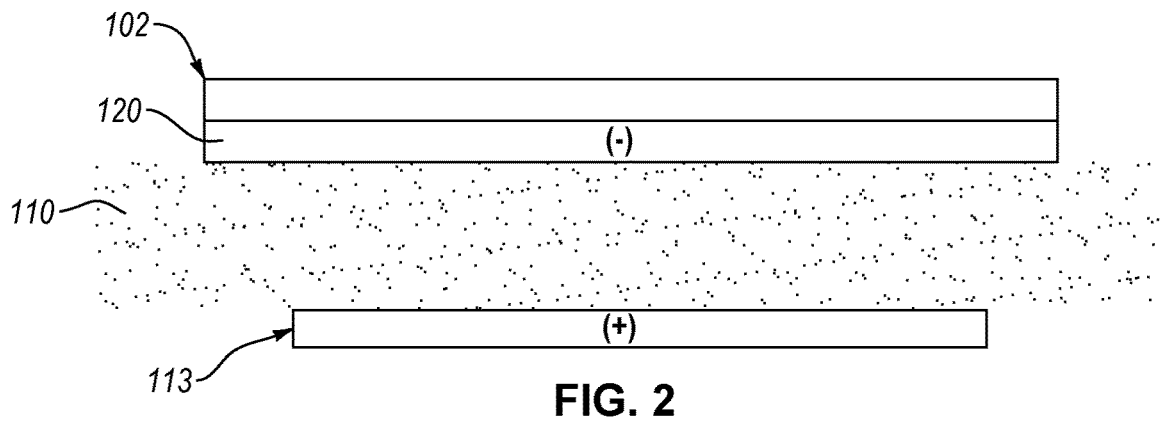
FIG. 2 is a schematic, side elevation view of a deposition anode array and a build plate of the system of FIG. 1, according to one or more examples of the present disclosure.
Figure 3:
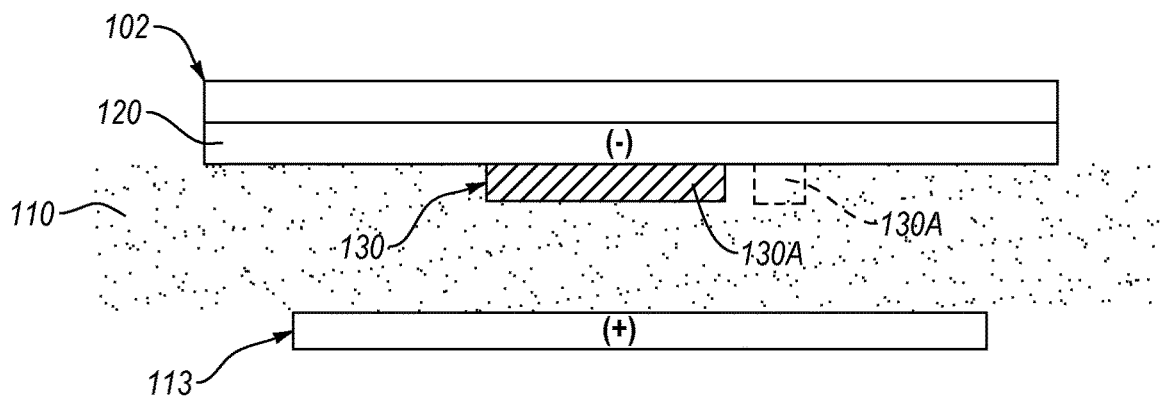
FIG. 3 is a schematic, partial-sectional, side elevation view of the deposition anode array and the build plate of the system of FIG. 1, shown with material deposited onto the build plate, according to one or more examples of the present disclosure.
Figure 19:
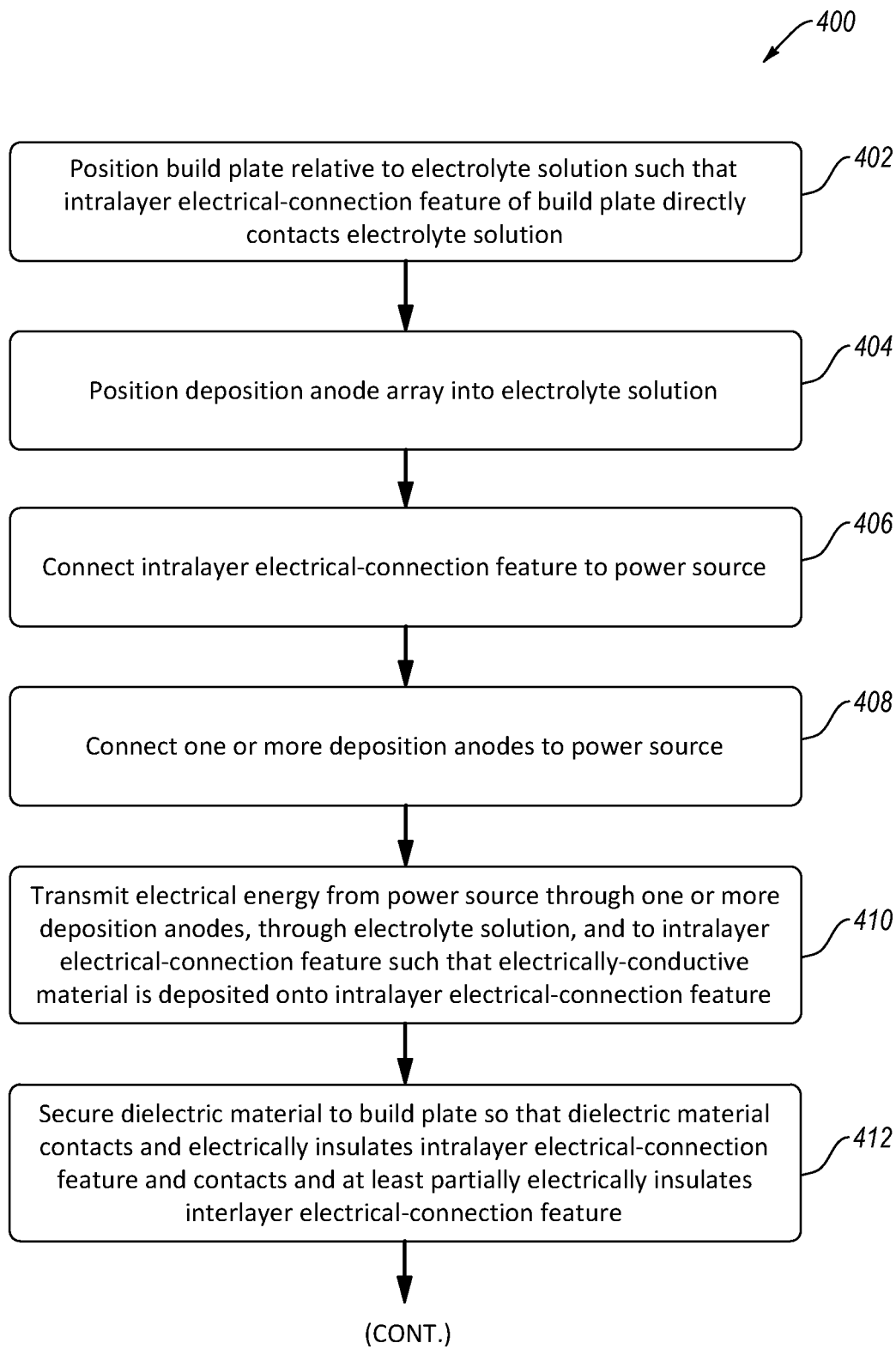
FIGS. 19-20 collectively are a schematic, block diagram of a method of making an electrical component, according to one or more examples of the present disclosure.
Figure 20:
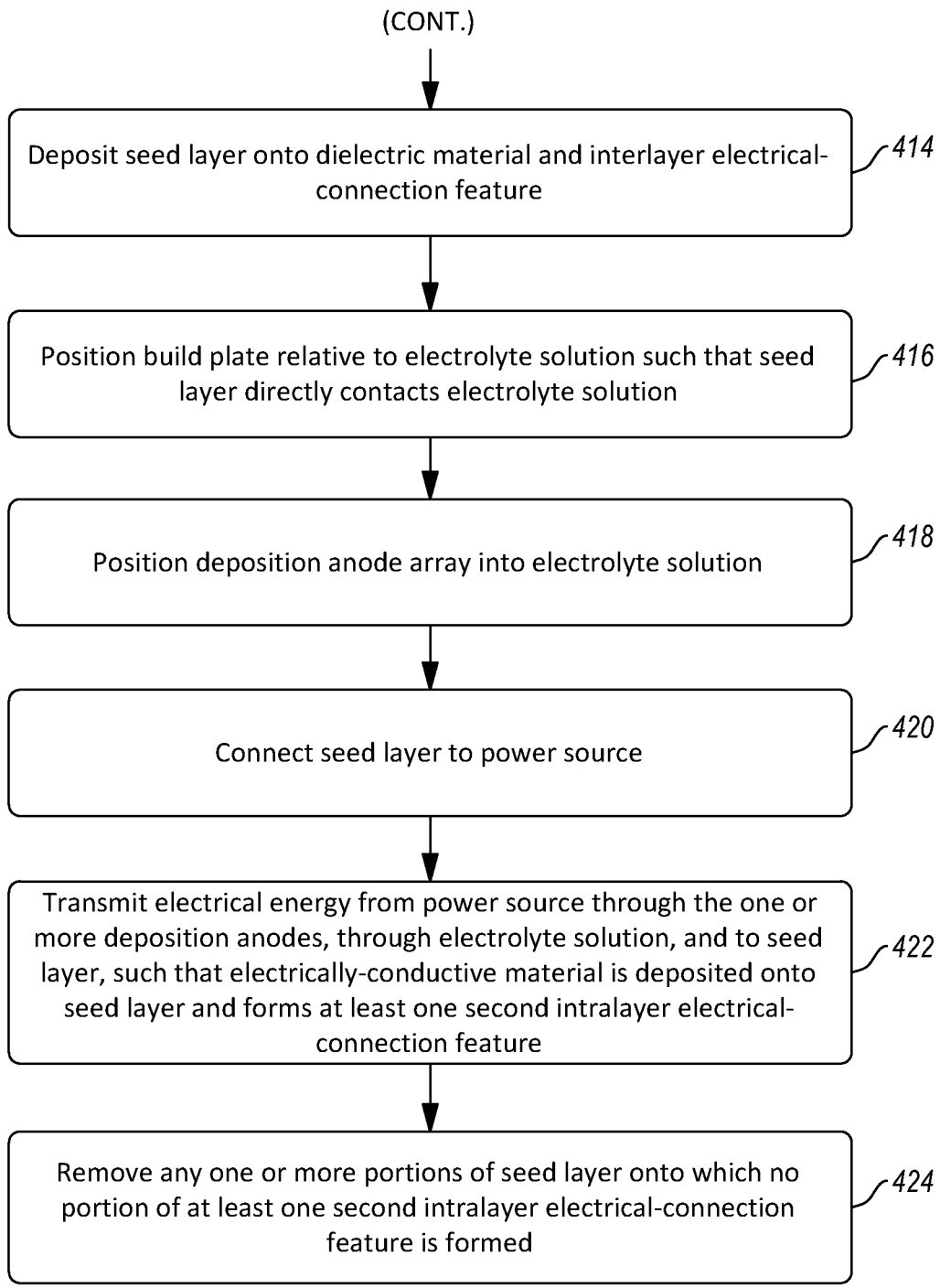

Referring to FIGS. 19 and 20, according to some examples, a method 400 of making an electrical component is disclosed. The method 400 includes (block 402) positioning the build plate 102 relative to the electrolyte solution 110 such that an intralayer electrical-connection feature 130A of the build plate 102 directly contacts the electrolyte solution 110. As shown in FIG. 3, the intralayer electrical-connection feature 130A forms part of the build plate 102 by being attached to or defining part of the cathode portion 120 of the build plate 102. Accordingly, in some examples, the intralayer electrical-connection feature 130A can be pre-formed using techniques, other than electrochemical deposition techniques, prior to being positioned into the electrolyte solution 110. For example, the intralayer electrical-connection feature 130A can be one or more patterned electrical traces, electrical pads, or other electronic features of an electrical component, such as a printed circuit board or integrated circuit. However, in certain examples, the cathode portion 120 is a non-patterned metallic plate and the intralayer electrical-connection feature 130A can be electrochemically deposited directly onto the non-patterned metallic plate of the cathode portion 120 using electrochemical deposition techniques, as described below. For example, as shown in FIG. 2, a cathode portion 120, which is non-patterned, can be positioned in direct contact with the electrolyte solution 110, and material 130 deposited onto the cathode portion 120, via electrochemical deposition, becomes the intralayer electrical-connection feature 130A. In some examples, the intralayer electrical-connection feature 130A has a thickness between, and inclusive of, 20 micrometers and 50 micrometers.

Figure 4:
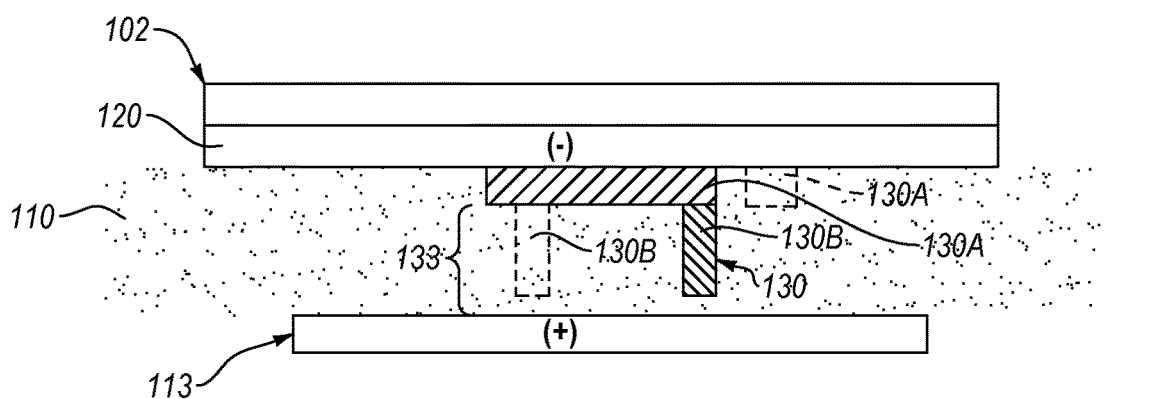
FIG. 4 is a schematic, partial-sectional, side elevation view of the deposition anode array and the build plate of FIG. 3, shown with additional material deposited onto the build plate, according to one or more examples of the present disclosure.

Referring to FIGS. 4 and 19, the method 400 further includes (block 404) positioning the deposition anode array 113, which includes the plurality of deposition anodes 111, into the electrolyte solution 110 such that a gap 133 is established between the intralayer electrical-connection feature 130A and the deposition anode array 113. The method 400 additionally includes (block 406) connecting the intralayer electrical-connection feature 130A of the build plate 102 to the power source 119. In certain examples, the system 100 enables direct connection of the intralayer electrical-connection feature 130A to the power source 119. However, in other examples, the intralayer electrical-connection feature 130A is indirectly connected to the power source 119, via the cathode portion 120 of the build plate 102, which can be directly connected to the power source 119. The method 400 also includes (block 408) connecting one or more deposition anodes of the plurality of deposition anodes 111 of the deposition anode array 113 to the power source 119.

Additionally, the method 400 includes (block 410) transmitting electrical energy from the power source 119 through the one or more deposition anodes of the plurality of deposition anodes 111, through the electrolyte solution 110, and to the intralayer electrical-connection feature 130A of the build plate 102, such that electrically-conductive material 130 is deposited onto the intralayer electrical-connection feature 130A. As shown in FIG. 4, the electrically-conductive material 130 forms an interlayer electrical-connection feature 130B of an electrical component. The interlayer electrical-connection feature 130B is formed on and extends from the intralayer electrical-connection feature 130A. In some examples, the electrical component is a printed circuit board (e.g., one layer of a multi-layer printed circuit board), the intralayer electrical-connection feature 130A is an electrical trace, electrical contact pad, or other electrical feature of the printed circuit board, and the interlayer electrical-connection feature 130B is a solid or hollow via of the printed circuit board. As defined herein, a via is an electrical connection between electrically conductive layers of a printed circuit board. The height of the interlayer electrical-connection feature 130B, when functioning as a via, is enough to bridge a thickness of the layer of the printed circuit board of which it forms. According to one example, the height of the interlayer electrical-connection feature 130B is between, and inclusive of, 100 micrometers and 3 millimeters.

Selectively activating one or more of the deposition anodes 111 to selectively control the electrical energy the deposition anodes 111 and selectively deposit the electrically-conductive material 130 at one or more locations corresponding with the activated deposition anodes 111 can be accomplished as described in U.S. patent application Ser.

No. 17/903,966, filed Sep. 6, 2022, which is incorporated herein by reference in its entirety.

Referring to FIGS. 5, 13, 15, 17(b), 18(c), 18(e), and 19, the method 400 includes (block 412) securing a dielectric material 142B to the build plate 102 so that the dielectric material 142B contacts and electrically insulates the intralayer electrical-connection feature 130A and contacts and at least partially electrically insulates the interlayer electrical-connection feature 130B. In some examples, the dielectric material 142B covers the intralayer electrical-connection feature 130A such that the intralayer electrical-connection feature 130A is embedded within the dielectric material 142B. The dielectric material 142B at least partially embeds the interlayer electrical-connection feature 130B. More specifically, in certain examples, the interlayer electrical-connection feature 130B is entirely embedded within the dielectric material 142B except for an exposed end of the interlayer electrical-connection feature 130B that is configured to be electrically connected to another electrically conductive layer of the electrical component. As used herein, the dielectric material can be any of various types of dielectric materials, such as a glass-reinforced dielectric material (e.g., epoxy laminate and polyimide material, such as FR4), a non-reinforced polymer material (e.g., polyimide, epoxy, phenolic resin, acrylic, polyether ether ketone (PEEK), acrylonitrile butadiene styrene (ABS), polyvinyl chloride (PVC), silicone, and the like), and/or other materials (e.g., glass, aluminum, ceramic, etc.)

Figure 5:
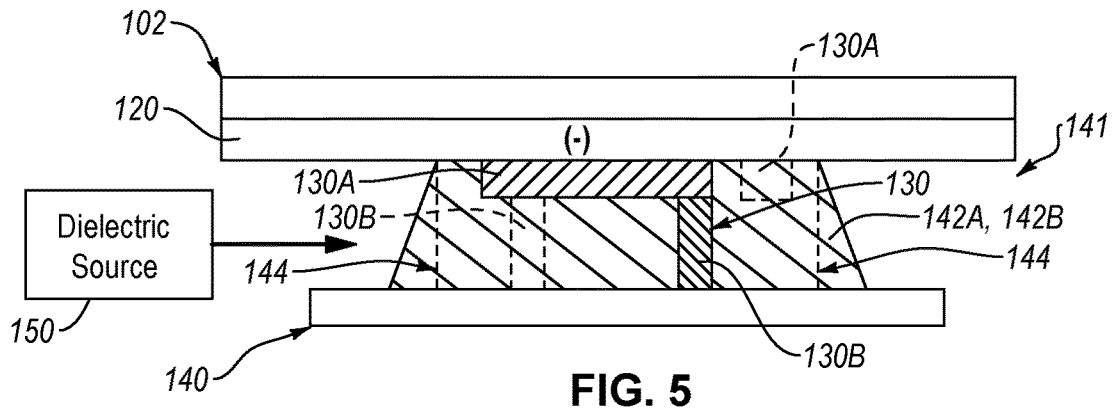
FIG. 5 is a schematic, partial-sectional, side elevation view of the build plate of FIG. 4, shown with a dielectric material deposited onto the build plate, according to one or more examples of the present disclosure.
Figure 6:
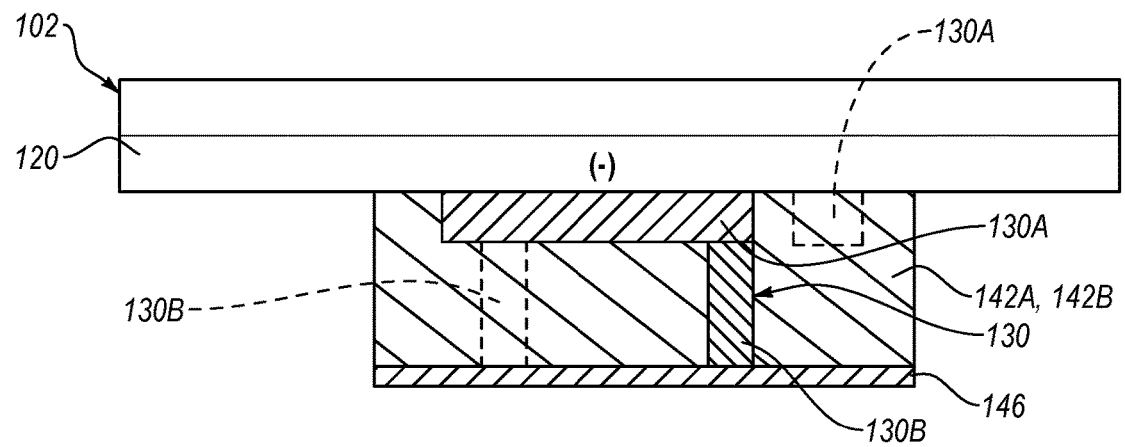
FIG. 6 is a schematic, partial-sectional, side elevation view of the build plate of FIG. 5, shown with a seed layer on the dielectric material of FIG. 5, according to one or more examples of the present disclosure.

As shown in FIGS. 5 and 17(b), in some examples, the dielectric material 142B is secured to the build plate 102 by flowing the dielectric material 142B, when in a flowable state, into contact with the intralayer electrical-connection feature 130A and the interlayer electrical-connection feature 130B. The dielectric material 142B can also be flowed into contact with other portions of the build plate 102. The dielectric material 142B can be received from a dielectric source 150, which can store the dielectric material 142B in a flowable state. The dielectric source 150 forms part of a dielectric application station 202, which an include other components, such as pumps, nozzles, etc. that facilitate flowing the dielectric material 142B. To help contain the dielectric material 142B in place relative to the intralayer electrical-connection feature 130A and the interlayer electrical-connection feature 130B, in some examples, the dielectric application station 202 includes dielectric containment structure 140, such as a stopping plate, die, mold, or other container. The build plate 102, the intralayer electrical-connection feature 130A, and the interlayer electrical-connection feature 130B can be moved out of the electrolyte solution 110 and into a position that is offset from the dielectric containment structure 140 (see, e.g., FIG. 5), such that a gap 141 is defined between the dielectric containment structure 140 and the build plate 102. The intralayer electrical-connection feature 130A and the interlayer electrical-connection feature 130B are located in the gap 141. The dielectric material 142B is then flowed into and fills the gap 141, after which it solidified (e.g., cured). The dielectric containment structure 140 helps to contain the dielectric material 142B in the flowable state, and promotes the formation of a uniform planar surface of the dielectric material 142B. The dielectric application station 202 can include components or devices (e.g., fans, ovens, autoclaves, UV lights, etc.) that aid in the solidifying (e.g., curing) the dielectric material 142B.

Referring to FIG. 17, in some examples, the system 100 includes a dielectric trimming station 204 that is configured to shape (e.g., trim away excess portions) of the dielectric material 142B after the dielectric material 142B solidifies. In FIG. 5, the dashed lines identify trim lines along which excess portions of the dielectric material 142B are removed (e.g., cut, abraded, etched, etc.).

As shown in FIGS. 13, 15, 18(c), and 18(e), in some examples, the dielectric material 142B is secured to the build plate 102 by forming the dielectric material 142B into a patterned dielectric substrate 145B and attaching it to the build plate 102. The patterned dielectric substrate 145B can be formed before or after the interlayer electrical-connection feature 130B is formed. In some examples, the patterned dielectric substrate 145B is formed by the patterned dielectric station 210. According to certain examples, the patterned dielectric station 210 forms the patterned dielectric substrate 145B in a process separate from that of the interlayer electrical-connection feature 130B such that the patterned dielectric substrate 145B is at least in a solidified state when the patterned dielectric substrate 145B is secured to the build plate 102. Preferably, the patterned dielectric substrate 145B is in a finished state when the patterned dielectric substrate 145B is secured to the build plate 102. The patterning of the patterned dielectric substrates of various examples disclosed herein can be formed using any of various techniques, such as selective UV curing of the dielectric material forming the substrate.

Figure 13:
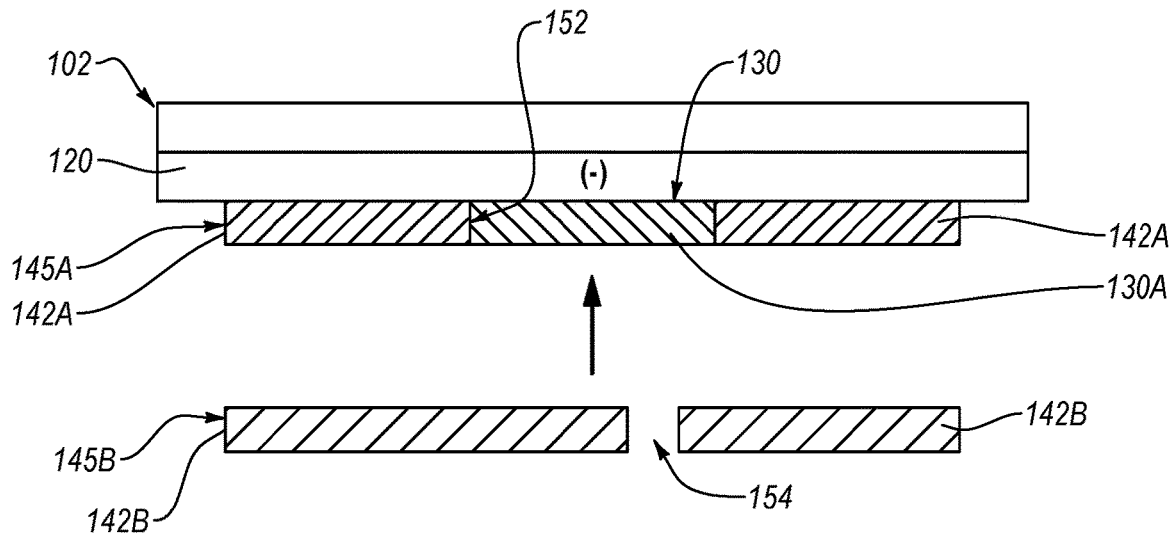
FIG. 13 is a schematic, partial-sectional, side elevation view of the build plate of FIG. 12, shown with a second patterned dielectric substrate being attached to the patterned dielectric substrate, according to one or more examples of the present disclosure.
Figure 14:
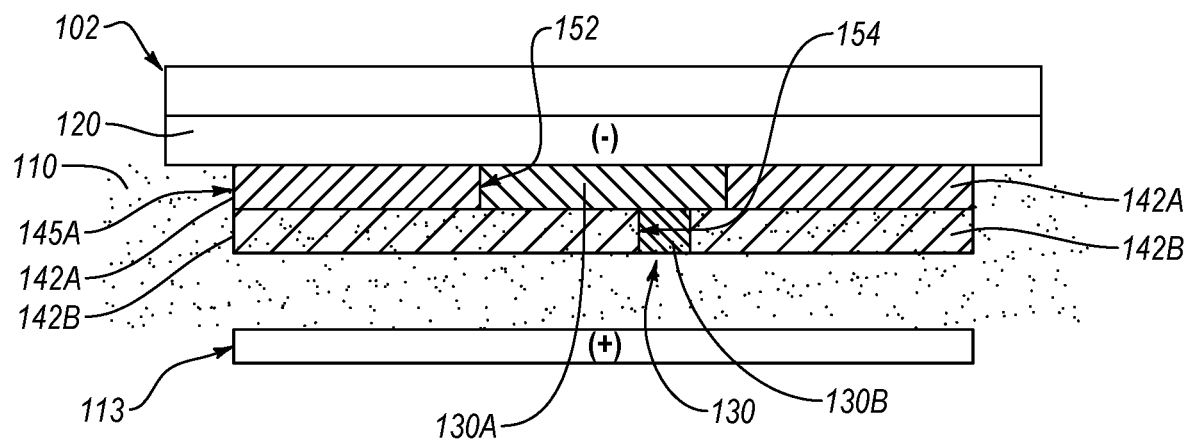
FIG. 14 is a schematic, partial-sectional, side elevation view of the deposition anode array and the build plate of FIG. 13, shown with additional material deposited onto the build plate, according to one or more examples of the present disclosure.

The patterned dielectric substrate 145B includes an opening 154. Referring to FIGS. 13, 14, and 18(d), when the patterned dielectric substrate 145B is attached to the build plate 102 before the interlayer electrical-connection feature 130B is formed, the interlayer electrical-connection feature 130B is formed at block 410 by depositing the electrically-conductive material 130 into the opening 154 of the patterned dielectric substrate 145B. The opening 154 in the patterned dielectric substrate 145B enables a surface of the intralayer electrical-connection feature 130A to be in direct contact with the electrolyte solution 110, which allows the electrical energy to be transmitted to the intralayer electrical-connection feature 130A and the electrically-conductive material 130 to be deposited into the opening 154 and onto the intralayer electrical-connection feature 130A. In this manner, the opening 154 can act as mold to shape the deposited material.

Figure 15:
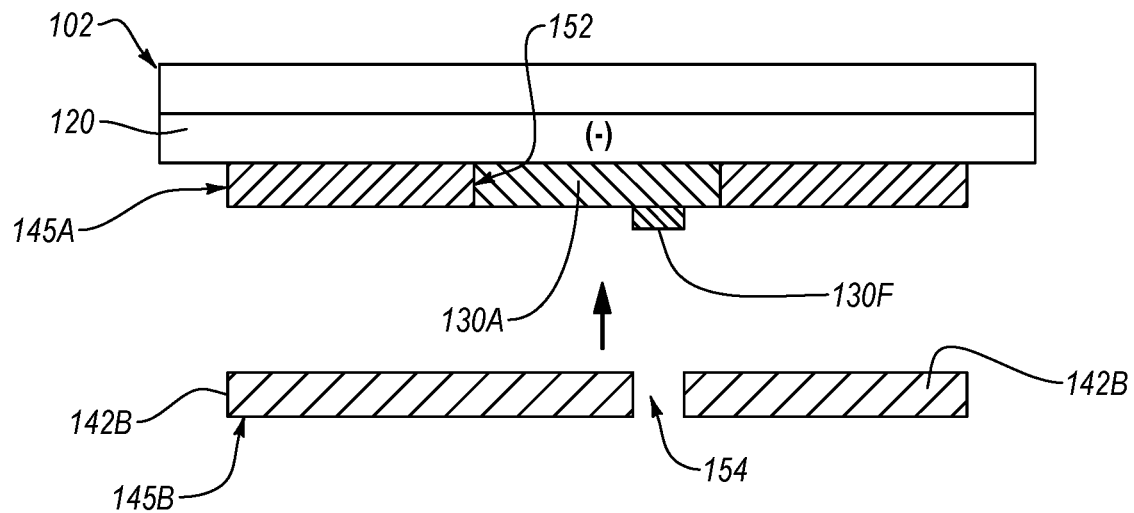
FIG. 15 is a schematic, partial-sectional, side elevation view of the build plate of FIG. 11, shown with a second patterned dielectric substrate being attached to the patterned dielectric substrate, according to one or more examples of the present disclosure.
Figure 16:
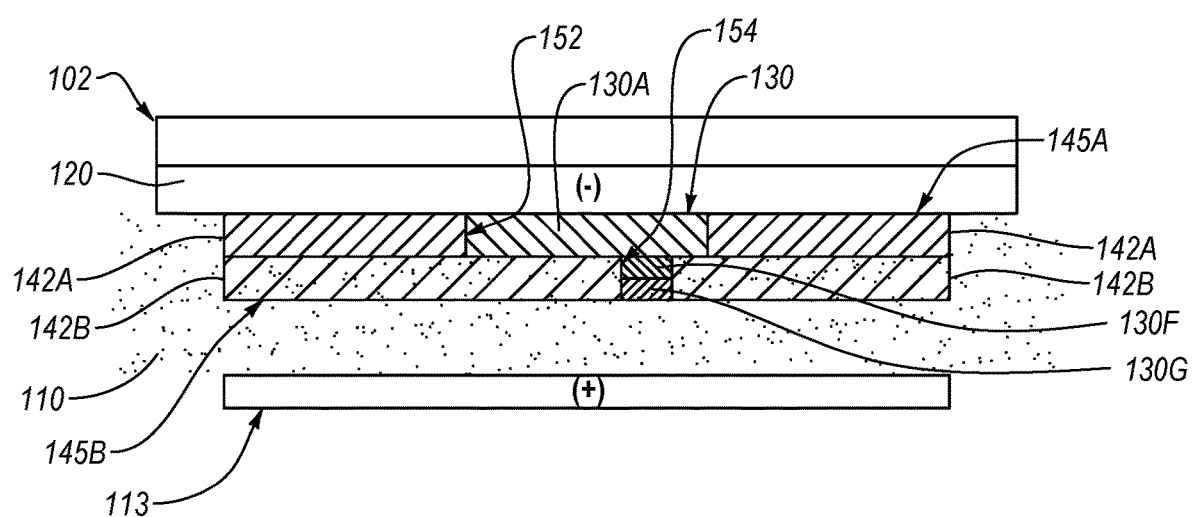
FIG. 16 is a schematic, partial-sectional, side elevation view of the deposition anode array and the build plate of FIG. 15, shown with additional material deposited onto the build plate, according to one or more examples of the present disclosure.

In contrast, referring to FIGS. 15, 16, and 18(e), when the patterned dielectric substrate 145B is attached to the build plate 102 after the interlayer electrical-connection feature 130B is formed, the patterned dielectric substrate 145B is attached to the build plate 102 so that the interlayer electrical-connection feature 130B is received within or inserted into the opening 154. In certain examples, as shown in FIG. 18(e), the entirety of the interlayer electrical-connection feature 130B is formed before the patterned dielectric substrate 145B is attached, so that the interlayer electrical-connection feature 130B passes entirely through the opening 154. However, in other examples, as shown in FIGS. 15 and 16, only a portion 130F of the interlayer electrical-connection feature 130B is formed before the patterned dielectric substrate 145B is attached to the build plate 102. Accordingly, referring to FIG. 16, the portion 130F passes through only a portion of the opening 154. After the patterned dielectric substrate 145B is attached to the build plate 102, the build plate 102 and the patterned dielectric substrate 145B is positioned in the electrolyte solution 110, along with the deposition array 113, and an additional portion 130G of the electrically-conductive material 130 is deposited into the opening 154 and onto the portion 130F of the interlayer electrical-connection feature 130B to complete the interlayer electrical-connection feature 130B. In this manner, the portion 130F can act as a guide to position the patterned dielectric substrate 145B and the opening 154 can act as mold to shape the portion 130F of the deposited material.

Figure 12:
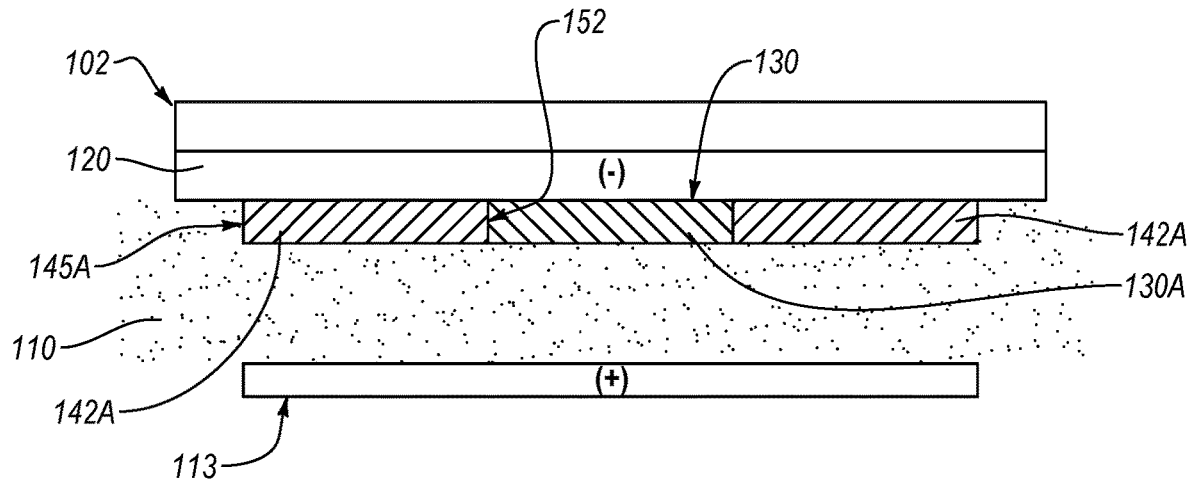
FIG. 12 is a schematic, partial-sectional, side elevation view of the deposition anode array and the build plate of FIG. 11, shown with material deposited onto the build plate, according to one or more examples of the present disclosure.

According to some examples, the intralayer electrical-connection feature 130A is formed via electrochemical deposition. More specifically, the cathode portion 120 of the build plate 102 and the deposition anode array 113 are positioned in the electrolyte solution 110, as shown in FIGS. 2, 3, and 12. The cathode portion 120 is connected to the power source 119 and when electrical energy is transmitted from the power source 119 through one or more deposition anodes of the plurality of deposition anodes 111, through the electrolyte solution 110, and to the cathode portion 120, electrically-conductive material 130 is deposited onto the cathode portion 120 and forms the intralayer electrical-connection feature 130A. The intralayer electrical-connection feature 130A is at least partially electrically isolated by a dielectric material 142A secured to the build plate 102.

In some examples, as shown in FIGS. 11, 12, 18(a), and 18(b), the dielectric material 142A can be formed into a patterned dielectric substrate 145A and attached to the build plate 102 before or after the intralayer electrical-connection feature 130A is formed. In the illustrated examples, the patterned dielectric substrate 145A is formed and attached to the build plate 102. The patterned dielectric substrate 145A includes an opening 152. When the patterned dielectric substrate 145A is attached to the build plate 102 before the intralayer electrical-connection feature 130A is formed, the electrically-conductive material 130 is deposited into the opening 152 and onto the cathode portion 120. In this manner, the opening 152 can act as mold to shape the deposited material. In contrast, in other examples, the patterned dielectric substrate 145A is attached to the build plate 102 so that the intralayer electrical-connection feature 130A is received within or inserted into the opening 152.

Referring to FIGS. 5 and 17(b), in alternative examples, the dielectric material 142A, when in a flowable state, is flowed onto and around the intralayer electrical-connection feature 130A after the intralayer electrical-connection feature 130A is deposited onto the cathode portion 120. In certain examples, such as shown, the dielectric material 142A and the dielectric material 142B is the same dielectric material and flowed into contact with both the intralayer electrical-connection feature 130A and the interlayer electrical-connection feature 130B concurrently in the same step. However, in other examples, the dielectric material 142A can be flowed into contact with the intralayer electrical-connection feature 130A and the dielectric material 142B can be flowed into contact with the interlayer electrical-connection feature 130B in different, non-concurrent steps.

Referring to FIGS. 6, 17(d), 18(f), and 20, after the dielectric material 142B is secured in block 412, the method 400 includes (block 412) depositing a seed layer 146 onto the dielectric material 142B and the interlayer electrical-connection feature 130B. The seed layer 146 is made of an electrically conductive material, such as a metallic material (e.g., copper, nickel, nickel-phosphorus, gold, etc.). According to one example, the seed layer 146 can be electrochemically deposited in the same manner as the interlayer electrical-connection feature 130B. However, in more preferable examples, the seed layer 146 is deposited via a plating technique, other than electrochemical deposition. For example, the plating station 206 can be configured to deposit (e.g., plate) the seed layer 146 onto the dielectric material 142B and the interlayer electrical-connection feature 130B using one of an electroless plating process, electroplating process, or other metal plating technique (e.g., physical vapor deposition (sputtering), spray coating, blade coating, foil lamination, thermal decomposition of precursors, etc.). According to some examples, the thickness of the seed layer 146 is thin relative to the thickness of the dielectric material 142B and the thickness of the interlayer electrical-connection feature 130B. The seed layer 146 provides an electrically conductive surface on which additional electrical-connection features can be deposited.

According to one example, the seed layer 146 is formed using an electroplating process that includes cleaning and etching the surface of the dielectric material 142B. This can be done using either a liquid (e.g., a mixture of chromic and sulfuric acid), a gaseous etchant (e.g., sulfur trioxide), or physical means (e.g., argon or oxygen plasma treatment, sandblasting, bead blasting, and the like). A colloidal suspension of metallic particles (e.g., copper, nickel, tin, gold, palladium, silver, platinum, lead, zinc, cobalt, iron, etc.) is then applied to the treated surface of the dielectric material 142B to create a conductive surface. The conductive surface is electrically connected to an electrical energy source and an electrochemical process is used to increase the thickness of the seed layer 146. In some examples, the surface of the seed layer 146 can be roughened to promote adhesion of the second intralayer electrical-connection feature(s) 130C, as described below.

According to other examples, the seed layer 146 is formed using an electroless process that includes catalyzing the surface of the dielectric material 142B (e.g., by depositing a catalytic material) and placing a metal salt and a reducing agent in contact with the catalyzed surface. In one example, the reducing agent is formaldehyde and the catalyst can be palladium or a palladium/tin alloy. The reaction at the surface results in metallic copper being affixed to the catalyzed surface. The catalyst can be patterned on the surface of the dielectric material 142B, such as by using an inkjet process or by selectively etching away portions of the catalyst.

Figure 7:
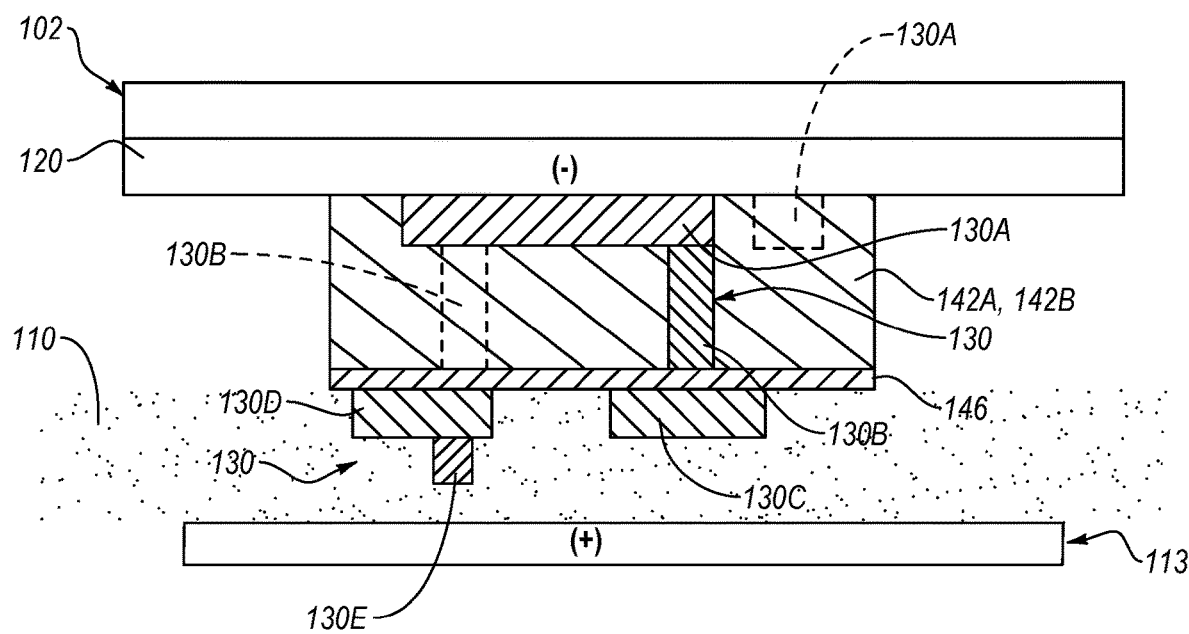
FIG. 7 is a schematic, partial-sectional, side elevation view of the deposition anode array and the build plate of FIG. 6, shown with material deposited onto the seed layer of FIG. 6, according to one or more examples of the present disclosure.

After the seed layer 146 is deposited in block 412, as shown in FIGS. 7, 17(e), and 18(g), at least one second intralayer electrical-connection feature is formed on the seed layer 146. In FIG. 7, two second intralayer electrical-connection features are formed (e.g., a second electrical-connection feature 130C and a second second-intralayer electrical-connection feature 130D). According to some examples, the method 400 further includes (block 416) positioning the build plate 102 relative to the electrolyte solution 110, such that the seed layer 146 directly contacts the electrolyte solution 110, (block 418) positioning the deposition anode array 113 into the electrolyte solution 110, such that a gap 133 is established between the seed layer 146 and the deposition anode array 113, and (block 420) connecting the seed layer 146 to the power source 119.

The method 400 also includes (block 422) transmitting electrical energy from the power source 119 through the one or more deposition anodes of the plurality of deposition anodes 111, through the electrolyte solution 110, and to the seed layer 146, such that electrically-conductive material 130 is deposited onto at least a portion of the seed layer 146 and forms the at least one second intralayer electrical-connection feature 130C of the electrical component. Separate ones of the plurality of deposition anodes 111 can be activated so that the electrically-conductive material 130 is deposited onto the seed layer 146 at multiple, spaced-apart locations to form more than one second intralayer electrical connection feature (e.g., the second intralayer electrical-connection feature 130C and the second second-intralayer electrical-connection feature 130D). Because the interlayer electrical-connection feature 130B and the second intralayer electrical-connection feature 130C are made during separate electrochemical deposition steps, in some examples, a different type of the electrolyte solution 110 can be used for each step so that the material of the interlayer electrical-connection feature 130B is a different type than the material of the second intralayer electrical-connection feature 130C.

According to some examples, when the second intralayer electrical-connection feature(s) is in direct contact with the electrolyte solution 110, electrically-conductive material 130 can be deposited onto the second intralayer electrical-connection feature(s) to form at least one second interlayer electrical-connection feature. According to one example shown in FIG. 7, a second interlayer electrical-connection feature 130E is formed on the second second-intralayer electrical-connection feature 130D.

Figure 8:
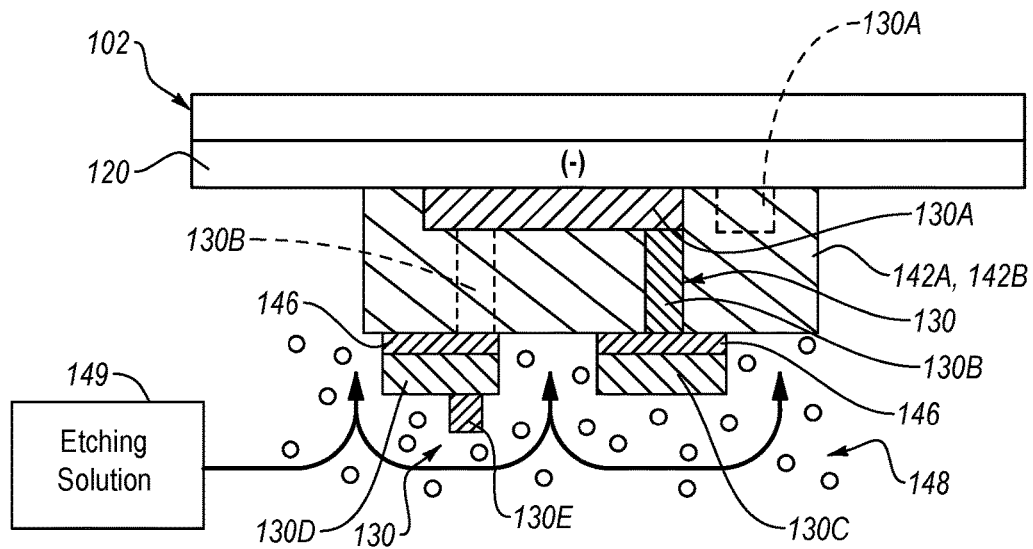
FIG. 8 is a schematic, partial-sectional, side elevation view of the build plate of FIG. 7, showing an etching process that removes some of the seed layer of FIG. 6, according to one or more examples of the present disclosure.

After the at least one second intralayer electrical-connection feature 130C, and optionally the second interlayer electrical-connection feature 130E, is formed on the seed layer 146, as shown in FIGS. 8, 17(f), and 18(h), the method 400 additionally includes (block 424) removing any one or more portions of the seed layer 146 onto which no portion of the at least one second intralayer electrical-connection feature 130C is formed. In other words, the exposed portions of the seed layer 146 are removed in block 424. Removal of the portion or portions of the seed layer 146 can be accomplished using any of various methods. According to one example, as illustrated, the etching station 208 of the system 100 is configured to etch away the one or more portions of the seed layer 146 using a conventional metal etching process, which uses an etching solution 149 (see, e.g., FIG. 8). When multiple second intralayer electrical-connection features 130C are formed, etching away the seed layer 146 in this manner results in electrical isolation of the second intralayer electrical-connection features 130C from each other.

In some examples, after the seed layer 146 is etched away, the resulting combination of the intralayer electrical-connection feature 130A, the interlayer electrical-connection feature 130B, the second intralayer electrical-connection feature 130C, and the dielectric material 142B is removed (e.g., peeled away) from build plate 102 and forms a finished product 200 or a portion of a finished product 200. The finished product 200 can be a printed circuit board or a layer of a printed circuit board, in some examples. Although a second dielectric material 142C is shown forming the finished product 200 in FIG. 10, in some examples, the finished product does not include the second dielectric material 142C.

Figure 9:
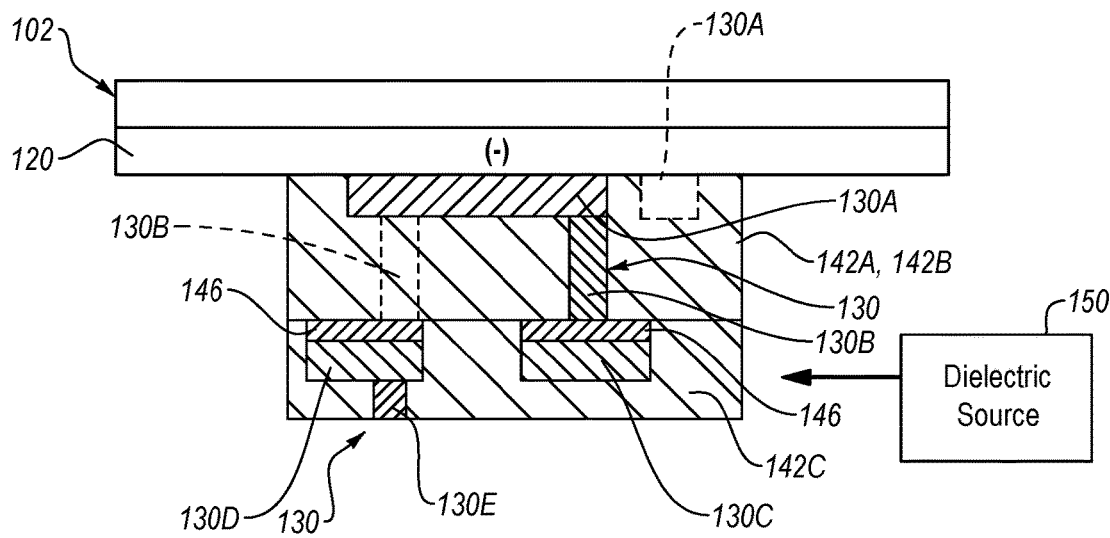
FIG. 9 is a schematic, partial-sectional, side elevation view of the build plate of FIG. 8, shown with additional dielectric material, according to one or more examples of the present disclosure.
Figure 10:
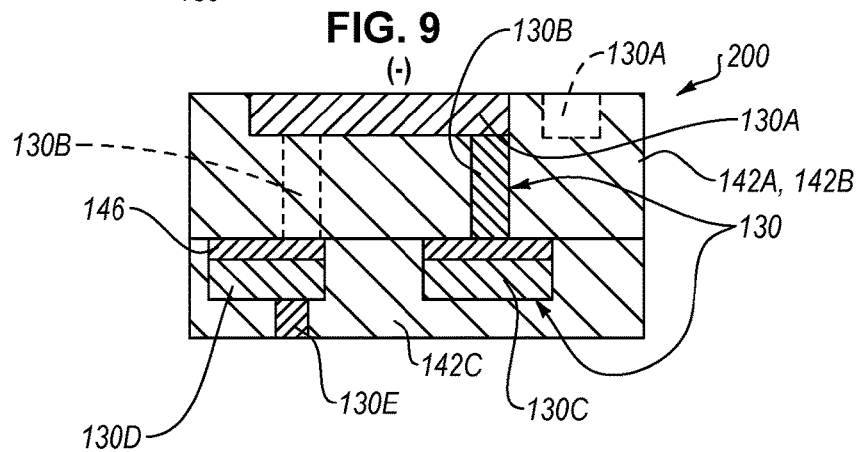
FIG. 10 is a schematic, partial-sectional, side elevation view of an electrical component made using the system of FIG. 1, according to one or more examples of the present disclosure.
Figure 11:
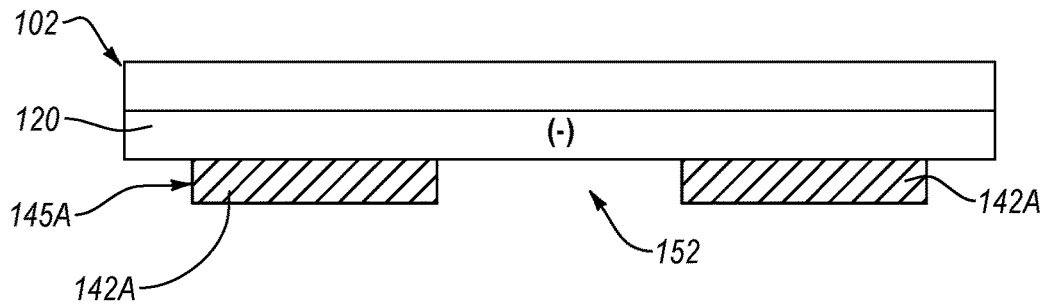
FIG. 11 is a schematic, partial-sectional, side elevation view of a build plate of the system of FIG. 1, shown with a patterned dielectric substrate attached to the build plate, according to one or more examples of the present disclosure.

According to alternative examples, as shown in FIGS. 9, 17(g)-(i), and 18(i)-(j), the method 400 includes an additional step of securing a second dielectric material 142C to the dielectric material 142B so that the second dielectric material 142C contacts and electrically insulates the at least one second intralayer electrical-connection feature 130C. When a second interlayer electrical-connection feature 130E has been formed, the second dielectric material 142C can contact and at least partially electrically insulate the second interlayer electrical-connection feature 130E, as shown in FIG. 9. The second dielectric material 142C can be secured to the dielectric material 142B by flowing the second dielectric material 142C, when in a flowable state (e.g., FIGS. 9 and 17(g)-(i)), or forming a patterned dielectric substrate 145C made of the second dielectric material 142C and attaching the substrate to the dielectric material 142B (see, e.g., FIGS. 18(i)-(j). Referring to FIG. 10, the finished product 200 can include the second dielectric material 142C in some examples. However, as explained above, in some examples, the finished product does not include the second dielectric material 142C or the patterned dielectric substrate 145C.

Additional components, materials, and/or layers can be added to the finished product 200 in some examples. For example, a solder mask layer and/or a silkscreen can be applied onto the dielectric material 142B and the second intralayer electrical-connection feature 130C, such as via a printing processes.

Other features and steps of the system 100 and the method 400, respectively, can be found in U.S. patent application Ser. No. 17/112,909, filed December 2020, which is incorporated herein by reference in its entirety.

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two." Moreover, unless otherwise noted, as defined herein a plurality of particular features does not necessarily mean every particular feature of an entire set or class of the particular features.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The schematic flow chart diagram included herein is generally set forth as logical flow chart diagram. As such, the depicted order and labeled steps are indicative of one example of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown. Blocks represented by dashed lines indicate alternative operations and/or portions thereof. Dashed lines, if any, connecting the various blocks represent alternative dependencies of the operations or portions thereof. It will be understood that not all dependencies among the various disclosed operations are necessarily represented.

Many of the functional units described in this specification have been described as part of a controller, in order to more particularly emphasize their implementation independence. The controller may be implemented as a hardware circuit comprising custom VLSI circuits or gate arrays, off-the-shelf semiconductors such as logic chips, transistors, or other discrete components. The controller may also be implemented in programmable hardware devices such as field programmable gate arrays, programmable array logic, programmable logic devices or the like.

The controller may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for examples may be written in any combination of one or more programming languages including an object-oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The described features, structures, or characteristics of the examples may be combined in any suitable manner. In the above description, numerous specific details are provided, such as examples of programming, software modules, user selections, network transactions, database queries, database structures, hardware modules, hardware circuits, hardware chips, etc., to provide a thorough understanding of examples. One skilled in the relevant art will recognize, however, that examples may be practiced without one or more of the specific details, or with other methods, components, materials, and so forth. In other instances, well-known structures, materials, or operations are not shown or described in detail to avoid obscuring aspects of an example.

Aspects of the examples are described above with reference to schematic flowchart diagrams and/or schematic block diagrams of methods, apparatuses, systems, and program products according to examples. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the figures illustrate the architecture, functionality, and operation of possible implementations of apparatuses, systems, methods and program products according to various examples. In this regard, each block in the schematic flowchart diagrams and/or schematic block diagrams may represent a module, segment, or portion of code, which comprises one or more executable instructions of the code for implementing the specified logical function(s).

The present subject matter may be embodied in other specific forms without departing from its spirit or essential characteristics. The described examples are to be considered in all respects only as illustrative and not restrictive. All changes which come within the meaning and range of equivalency of the claims are to be embraced within their scope.

What is claimed is:

1. A method of making an electrical component, the method comprising steps of:
   positioning a build plate relative to an electrolyte solution such that an intralayer electrical-connection feature of the build plate directly contacts the electrolyte solution;
   positioning a deposition anode array, comprising a plurality of deposition anodes, into the electrolyte solution such that a gap is established between the intralayer electrical-connection feature and the deposition anode array;
   connecting the intralayer electrical-connection feature of the build plate to a power source;
   connecting one or more deposition anodes of the plurality of deposition anodes to the power source;
   transmitting electrical energy from the power source through the one or more deposition anodes of the plurality of deposition anodes, through the electrolyte solution, and to the intralayer electrical-connection feature of the build plate, such that electrically-conductive material is deposited onto the intralayer electrical-connection feature and forms an interlayer electrical-connection feature of the electrical component, the interlayer electrical-connection feature being formed on the intralayer electrical-connection feature;
   securing a dielectric material to the build plate so that the dielectric material contacts and electrically insulates the intralayer electrical-connection feature and contacts and at least partially electrically insulates the interlayer electrical-connection feature;
   depositing a seed layer, made of an electrically conductive material, onto the dielectric material and the interlayer electrical-connection feature;
   positioning the build plate relative to the electrolyte solution such that the seed layer directly contacts the electrolyte solution;
   positioning the deposition anode array into the electrolyte solution such that a gap is established between the seed layer and the deposition anode array;
   connecting the seed layer to the power source;
   transmitting electrical energy from the power source through the one or more deposition anodes of the plurality of deposition anodes, through the electrolyte solution, and to the seed layer, such that electrically-conductive material is deposited onto at least a portion of the seed layer and forms at least one second intralayer electrical-connection feature of the electrical component; and
   removing any one or more portions of the seed layer onto which no portion of the at least one second intralayer electrical-connection feature is formed.

2. The method of claim 1, wherein the step of securing the dielectric material to the build plate comprises:
   flowing the dielectric material into contact with the build plate, the intralayer electrical-connection feature, and the interlayer electrical-connection feature; and
   solidifying the dielectric material.

3. The method of claim 2, further comprising moving the build plate, the intralayer electrical-connection feature, and the interlayer electrical-connection feature out of the electrolyte solution and into a position offset from a dielectric containment structure, wherein:
   flowing the dielectric material comprises flowing the dielectric material into a gap defined between the dielectric containment structure and the build plate; and
   the intralayer electrical-connection feature and the interlayer electrical-connection feature are located in the gap.

4. The method of claim 1, wherein the step of securing the dielectric material to the build plate comprises:
   forming a patterned dielectric substrate; and
   attaching the patterned dielectric substrate to the build plate.

5. The method of claim 4, wherein the patterned dielectric substrate is formed and attached to the build plate before the interlayer electrical-connection feature is formed.

6. The method of claim 5, wherein:
   the patterned dielectric substrate comprises an opening; and
   forming the interlayer electrical-connection feature comprises depositing the electrically-conductive material into the opening of the patterned dielectric substrate.

7. The method of claim 4, wherein the patterned dielectric substrate is attached to the build plate after the interlayer electrical-connection feature is formed.

8. The method of claim 7, wherein:

the patterned dielectric substrate comprises an opening; and the patterned dielectric substrate is attached to the build plate so that the interlayer electrical-connection feature is received within the opening.

9. The method of claim 8, wherein the interlayer electrical-connection feature occupies only a portion of the opening, the method further comprising:

positioning the build plate relative to the electrolyte solution such that interlayer electrical-connection feature of the build plate directly contacts the electrolyte solution;

positioning the deposition anode array, comprising the plurality of deposition anodes, into the electrolyte solution such that a gap is established between the interlayer electrical-connection feature and the deposition anode array;

connecting the interlayer electrical-connection feature of the build plate to the power source;

connecting one or more deposition anodes of the plurality of deposition anodes to the power source; and transmitting electrical energy from the power source through the one or more deposition anodes of the plurality of deposition anodes, through the electrolyte solution, and to the interlayer electrical-connection feature of the build plate, such that electrically-conductive material is deposited into the opening and onto the interlayer electrical-connection feature.

10. The method of claim 4, wherein:

the build plate further comprises a second dielectric material in contact with and at least partially electrically isolating the intralayer electrical-connection feature; and the dielectric material is secured to the second dielectric material of the build plate.

11. The method of claim 1, wherein:

the build plate comprises multiple intralayer electrical-connection features, which are electrically isolated from each other;

the multiple intralayer electrical-connection features are separately connected to the power source; and the electrical energy from the power source is concurrently and separately transmitted through two or more deposition anodes of the plurality of deposition anodes, through the electrolyte solution, and to the multiple intralayer electrical-connection features such that the electrically-conductive material is separately deposited onto each one of the multiple intralayer electrical-connection features and forms multiple interlayer electrical-connection features of the electrical component.

12. The method of claim 1, wherein:

the electrically-conductive material deposited onto the at least the portion of the seed layer further forms a second interlayer electrical-connection feature; and the second interlayer electrical-connection feature is formed on the at least one second intralayer electrical-connection feature.

13. The method of claim 1, wherein the electrically-conductive material deposited onto the intralayer electrical-connection feature forms multiple interlayer electrical-connection features, spaced-apart from each other about the intralayer electrical-connection feature.

14. The method of claim 1, wherein:

the electrical component is a printed circuit board;

the intralayer electrical-connection feature is an electrical trace or an electrical contact pad of the printed circuit board; and the interlayer electrical-connection feature is a via of the printed circuit board.

15. The method of claim 1, further comprising securing a second dielectric material to the dielectric material so that the second dielectric material contacts and electrically insulates the at least one second intralayer electrical-connection feature.

* * * * *